US012751320B2

(12) United States Patent
Chang et al.

(10) Patent No.: US 12,751,320 B2
(45) Date of Patent: Sep. 29, 2026

(54) CHIP-ON-WAFER-ON-BOARD STRUCTURE USING SPACER DIE AND METHODS OF FORMING THE SAME

(71) Applicant: Taiwan Semiconductor Manufacturing Company Limited, Hsinchu (TW)

(72) Inventors: Sheng-Kai Chang, Taipei City (TW); Leo Li, Hsinchu (TW); Chung-Hsien Hun, Zhubei City (TW); Lieh-Chuan Chen, Hsinchu City (TW); Chien-Li Kuo, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 1052 days.

(21) Appl. No.: 17/848,448

(22) Filed: Jun. 24, 2022

(65) Prior Publication Data

US 2023/0420429 A1 Dec. 28, 2023

(51) Int. Cl.

| | |
|---|---|
| ***H01L 25/16*** | (2023.01) |
| ***H10W 70/05*** | (2026.01) |
| ***H10W 70/60*** | (2026.01) |
| ***H10W 70/65*** | (2026.01) |
| ***H10W 70/695*** | (2026.01) |

(Continued)

(52) U.S. Cl.

CPC ......... *H10W 90/00* (2026.01); *H10W 70/093* (2026.01); *H10W 70/611* (2026.01); *H10W 70/65* (2026.01); *H10W 70/695* (2026.01); *H10W 72/0198* (2026.01); *H10W 74/014* (2026.01); *H10W 74/016* (2026.01); *H10W 74/019* (2026.01); *H10W 90/401* (2026.01); *H10W 90/701* (2026.01); *H10W 70/685* (2026.01); *H10W 74/00* (2026.01);

(Continued)

(58) Field of Classification Search

None

See application file for complete search history.

(56) References Cited

U.S. PATENT DOCUMENTS 10,866,373 B2 * 12/2020 Yu .......................... H01L 24/16
11,670,624 B2 * 6/2023 Bhagavat .............. H01L 21/568 257/668

(Continued)

FOREIGN PATENT DOCUMENTS

TW I758129 B 3/2022

OTHER PUBLICATIONS

TW Patent and Trademark Office; TW Application No. 112111642; Office Action mailed May 9, 2024; 10 pages.

*Primary Examiner* — Long Pham

(74) *Attorney, Agent, or Firm* — The Marbury Law Group, PLLC

(57) ABSTRACT

A semiconductor structure may include an interposer including on-interposer bump structures, at least one semiconductor die bonded to a first subset of the on-interposer bump structures through first solder material portions, at least one spacer die bonded to a second subset of the on-interposer bump structures through second solder material portions, and a molding compound die frame laterally surrounding each of the at least one semiconductor die and the at least one spacer die. Each of the at least one semiconductor die includes a respective set of transistors and a respective set of metal interconnect structures. Each of the at least one spacer die is free from any transistor therein.

20 Claims, 25 Drawing Sheets

(51) Int. Cl.

| | |
|---|---|
| ***H10W 72/00*** | (2026.01) |
| ***H10W 74/01*** | (2026.01) |
| ***H10W 90/00*** | (2026.01) |
| *H10W 70/685* | (2026.01) |
| *H10W 74/00* | (2026.01) |
| *H10W 74/15* | (2026.01) |
| *H10W 74/40* | (2026.01) |

(52) U.S. Cl.
CPC ............ *H10W 74/15* (2026.01); *H10W 74/40* (2026.01); *H10W 90/724* (2026.01); *H10W 90/734* (2026.01)

(56) References Cited

U.S. PATENT DOCUMENTS

| | | | | |
|---|---|---|---|---|
| 12,068,222 | B2 * | 8/2024 | Modi | H01L 21/56 |
| 2018/0331089 | A1 | 11/2018 | Fogal et al. | |
| 2020/0312700 | A1 * | 10/2020 | Kang | H01L 21/68707 |
| 2021/0375711 | A1 * | 12/2021 | Shen | H01L 24/92 |
| 2025/0174576 | A1 * | 5/2025 | Tsao | H01L 23/562 |

* cited by examiner

CHIP-ON-WAFER-ON-BOARD STRUCTURE USING SPACER DIE AND METHODS OF FORMING THE SAME

BACKGROUND

A packaging substrate may be used as an intermediate structure between at least one semiconductor die and a printed circuit board. In such instances, the at least one semiconductor die is attached to the packaging substrate, and the assembly of the packaging substrate and the at least one semiconductor die may be bonded to the printed circuit board such that the packaging substrate faces the printed circuit board. The bonding process that is used to attach the at least one semiconductor die to the packaging substrate is costly, and may be a significant yield detractor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
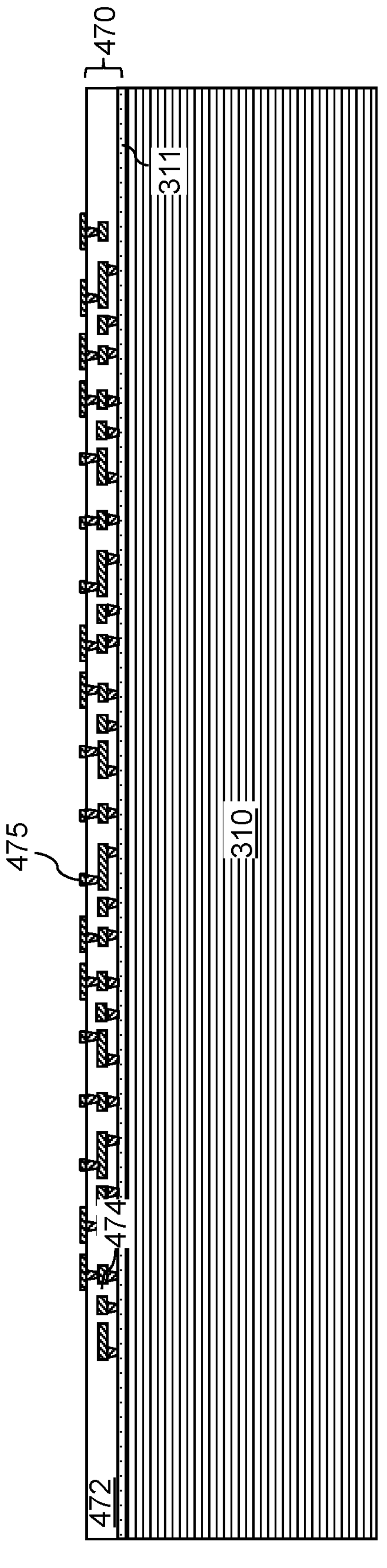
FIG. 1 is a vertical cross-sectional view of an exemplary structure after formation of die-side redistribution structures over a first carrier substrate according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein are directed to semiconductor devices, and particularly to a chip-on-wafer-on-board (CoWoB) structure using spacer dies and methods for forming the same. A chip-on-wafer-on-substrate (CoWoS®) structures use a fan-out package including a chip-on-wafer structure that is bonded to a packaging substrate. Thus, a packaging substrate functions as an intermediary structure between the fan-out package (which is a chip-on-wafer structure) and a printed circuit board. However, manufacture of a packaging substrate is costly, and die warpage during attachment to the packaging substrate may be a yield detractor.

Direct mounting of integrated fan-out package-on-package (InFO PoP) structures is constrained by a limited number of through InFO via (TIV) structures. As such, it is difficult for the InFO PoP structures to meet the fine pitch requirements for high speed signal transmission between a logic die and a memory die. Thus, the InFO PoP structures are not suitable for incorporating high bandwidth memory (HBM) dies, and further developments are needed to utilize InFO PoP structures for high-end applications.

According to an aspect of the present disclosure, a chip-on-wafer (CoW) method and a wafer-level packaging method are combined to substitute redistribution structures for a packaging substrate, and to provide a low-cost structure providing high-bandwidth high-speed signal transmission capacity. Spacer dies are used as structures that surround the semiconductor dies to provide a sufficiently large area for an interposer so that a sufficient number of bonding pads (including signal pads and input/output pads) may be provided on the side of the interposer that faces a printed circuit board. The fan-out package resulting from the various embodiment methods of the present disclosure incorporates a chip-on-wafer (CoW) feature and a wafer-level-packaging (WLP) feature to allow for direct mounting of the fan-out package on a printed circuit board. Various aspects of embodiments of the present disclosure are now described with reference to accompanying figures.

Referring to FIG. 1, an exemplary structure according to an embodiment of the present disclosure is illustrated. The exemplary structure includes a first carrier wafer 310. The first carrier wafer 310 may include an optically transparent substrate such as a glass substrate or a sapphire substrate, or may comprise a semiconductor substrate such as a silicon substrate. The diameter of the first carrier wafer 310 may be in a range from 150 mm to 450 mm, although lesser and greater diameters may be used. The thickness of the first carrier wafer 310 may be in a range from 500 microns to 2,000 microns, although lesser and greater thicknesses may also be used. Alternatively, the first carrier wafer 310 may be provided in a rectangular panel format. A first adhesive layer 311 may be applied to a front-side surface of the first carrier wafer 310. In one embodiment, the first adhesive layer 311 may be a light-to-heat conversion (LTHC) layer. Alternatively, the first adhesive layer 311 may include a thermally decomposing adhesive material.

A two-dimensional array of die-side redistribution structures 470 may be formed over the first carrier substrate 310. Specifically, a die-side redistribution structure 470 may be formed within each unit area of repetition, which corresponds to the area of an interposer to be individually diced. Semiconductor dies may be subsequently attached to the die-side redistribution structures 470, and thus, the redistribution structures formed at this processing step are referred to as die-side redistribution structures 470. While FIG. 1 illustrates a region within a unit area, repetition of the structure illustrated in FIG. 1 in two horizontal directions during manufacturing is understood.

Each die-side redistribution structure 470 may include die-side redistribution dielectric layers 472, die-side redistribution wiring interconnects 474, and microbump structures 475 (i.e., bump structures to be used to contact local silicon interconnect bridges from the die side). The die-side redistribution dielectric layers 472 include a respective dielectric polymer material such as polyimide (PI), benzocyclobutene (BCB), or polybenzobisoxazole (PBO). Other suitable dielectric polymer material Each die-side redistribution dielectric layer 472 may be formed by spin coating and drying of the respective dielectric polymer material. The thickness of each die-side redistribution dielectric layer 472 may be in a range from 2 microns to 40 microns, such as from 4 microns to 20 microns. Each die-side redistribution dielectric layer 472 may be patterned, for example, by applying and patterning a respective photoresist layer thereabove, and by transferring the pattern in the photoresist layer into the die-side redistribution dielectric layer 472 using an etch process such as an anisotropic etch process. The photoresist layer may be subsequently removed, for example, by ashing.

Each of the die-side redistribution wiring interconnects 474 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 300 nm, and the copper seed layer may have a thickness in a range from 100 nm to 500 nm. The metallic fill material for the die-side redistribution wiring interconnects 474 may include copper, nickel, or copper and nickel. The thickness of the metallic fill material that is deposited for each die-side redistribution wiring interconnect 474 may be in a range from 2 microns to 40 microns, such as from 4 microns to 10 microns, although lesser or greater thicknesses may also be used. The total number of levels of wiring in each die-side redistribution structure 470 (i.e., the levels of the die-side redistribution wiring interconnects 474) may be in a range from 1 to 10.

The microbump structures 475 are bump structures that may be subsequently used to electrically connect and bond local silicon interconnect bridges to a respective one of the die-side redistribution structures 470. The metallic fill material for the microbump structures 475 may include copper. Other suitable metallic fill materials are within the contemplated scope of disclosure. The microbump structures 475 may have horizontal cross-sectional shapes of rectangles, rounded rectangles, or circles. Other horizontal cross-sectional shapes may be within the contemplated scope of disclosure. Typically, the microbump structures 475 may be configured for microbump bonding (i.e., C2 bonding), and may have a thickness in a range from 30 microns to 100 microns, although lesser or greater thicknesses may also be used. In one embodiment, the microbump structures 475 may be formed as an array of microbumps (such as copper pillars) having a lateral dimension in a range from 10 microns to 25 microns, and having a pitch in a range from 20 microns to 50 microns.

Figure 2:
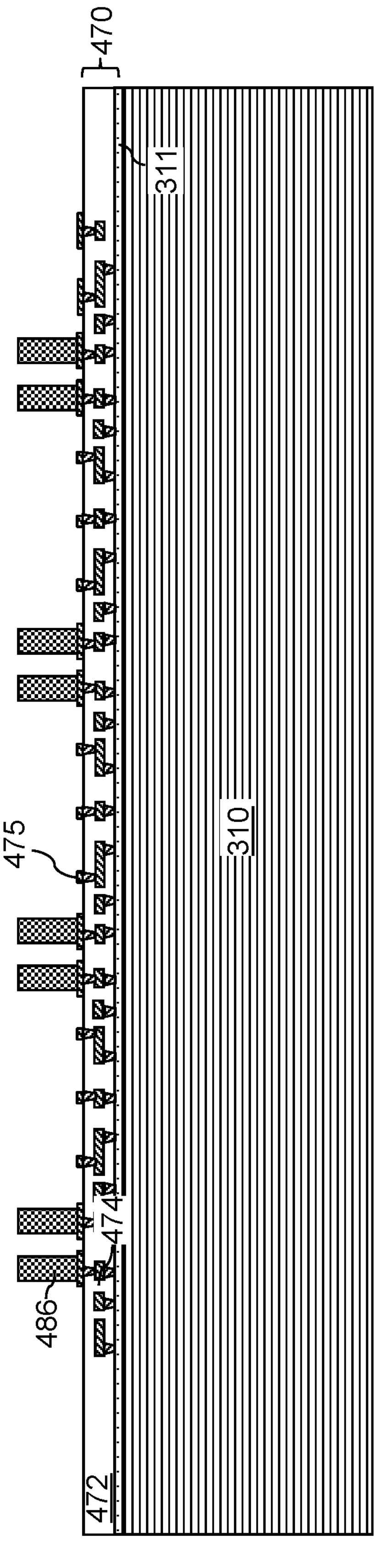
FIG. 2 is a vertical cross-sectional view of the exemplary structure after formation of through-integrated-fan-out-via structures (TIV structures) according to the embodiment of the present disclosure.

Referring to FIG. 2, a sacrificial matrix material layer (not shown) may be applied over the die-side redistribution structures 470, and cylindrical cavities may be formed through the sacrificial matrix material layer. The sacrificial matrix material layer may comprise a polymer material such as polyimide. The pattern of the cylindrical cavities may be arranged around regions in which the local silicon interconnect (LSI) bridges are to be subsequently placed. As such, the cylindrical cavities may be formed away from regions including a respective array of microbump structures 475. Generally, the pattern of the cylindrical cavities may be a periodic pattern that is arranged as a two-dimensional periodic array such as a rectangular array. Each unit pattern within the periodic pattern may have the same area as the area of an interposer to be manufactured. In other words, a two-dimensional array of interposers may be formed by performing subsequent processing patterns. As such, a unit area that corresponds to the area of a single interposer includes a unit pattern for the cylindrical cavities.

At least one conductive material such as at least one metallic material (such as W, Mo, Ta, Ti, WN, TaN, TiN, etc.) may be deposited in the cylindrical cavities, and excess portions of the at least one conductive material may be removed from above the horizontal plane including the top surface of the sacrificial matrix material layer. Remaining portions of the at least one conductive material comprise through-integrated-fan-out-via structures 486, which are also referred to through-InFO-via structures 486 or TIV structures 486. The sacrificial matrix material layer may be subsequently removed, for example, by dissolving in a solvent or by ashing. A plurality of local silicon interconnect bridges (LSI bridges) may be subsequently bonded to the die-side redistribution structures 470 using the microbump structures 475.

Figure 3:
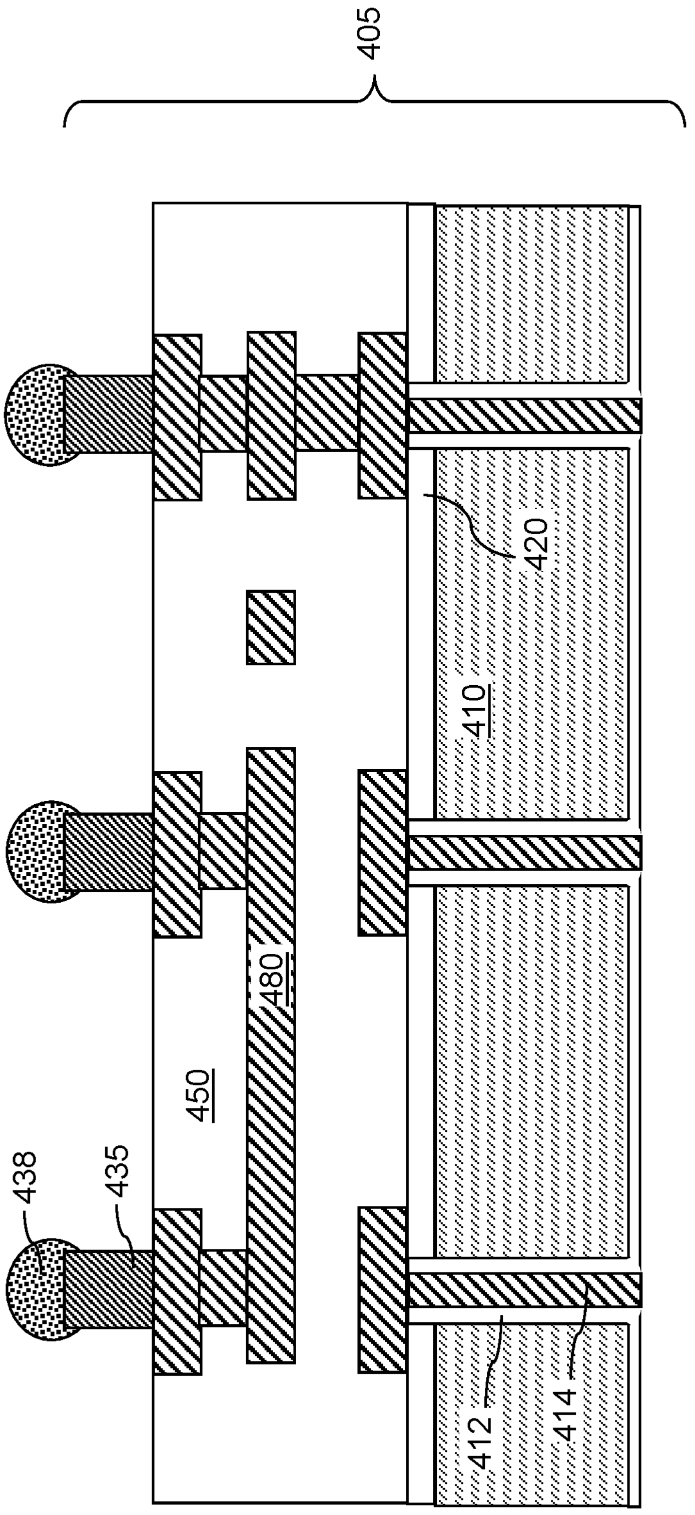
FIG. 3 is a vertical cross-sectional view of an exemplary local silicon interconnect (LSI) bridge that may be subsequently integrated into the exemplary structure.

Referring to FIG. 3, an example of a local silicon interconnect bridge (LSI bridge) 405 is illustrated. The LSI bridge 405 may include a silicon substrate 410 (as thinned and diced during manufacturing of the LSI bridge 405), through-substrate openings that vertically extend through the silicon substrate 410, a dielectric liner 412 that provides electrical isolation for through-silicon via structures 414, backside dielectric material layer 420, and metal interconnect structures 480 formed within dielectric material layers 450. The metal interconnect structures 480 may be electrically connected to the through-silicon via structures 414 and/or electrically connected thereamongst. LSI microbump structures 435 configured for C2 bonding may be provided on the topmost metal interconnect structures 480. Optionally, a subset of the metal interconnect structures 480 may provide electrical connection to a subset of the LSI microbump structures 435. Solder material portions 438 may be applied to the LSI microbump structures 435 in preparation for a subsequent bonding process.

Figure 4:
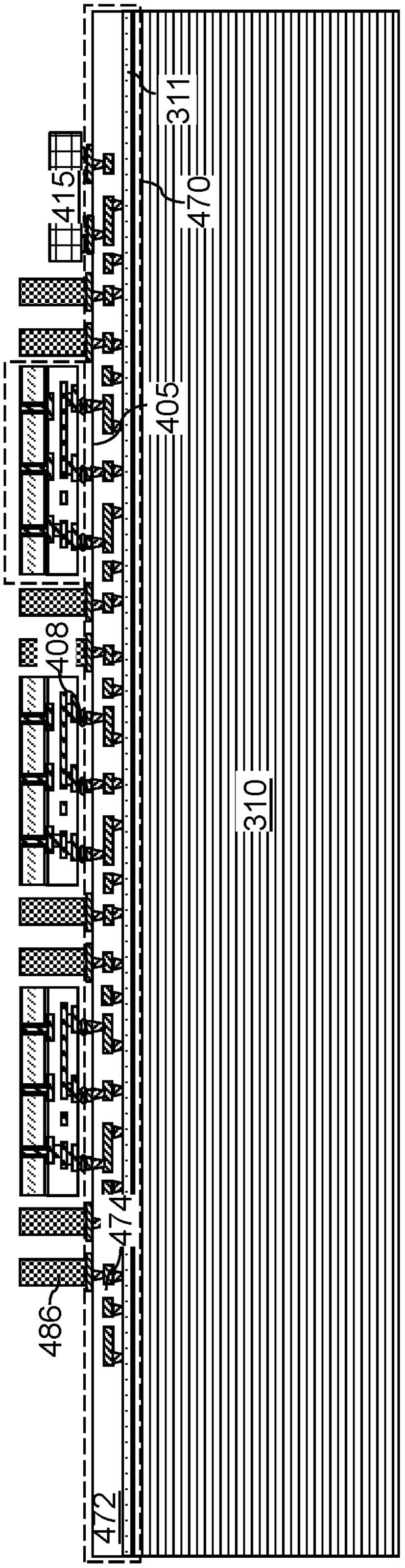
FIG. 4 is a vertical cross-sectional view of the exemplary structure after attaching LSI bridges to the die-side redistribution structures according to the embodiment of the present disclosure.

Referring to FIG. 4, the local silicon interconnect bridges (LSI bridges) 405 may be placed in vacant areas that are not occupied by the through-integrated-fan-out-via structures 486. Generally, any type of LSI bridges 405 known in the art may be used. The microbump structures 435 on the LSI bridges 405 may be bonded to the microbump structures 475 on the die-side redistribution structures 470 using arrays of solder material portions. Each bonded combination of a microbump structure 435 on an LSI bridge 405, a microbump structure 475 on a die-side redistribution structure 470, and a solder material portion is herein referred to as a microbump bonding structure 408. Generally, the LSI bridges 405 are bonded to the die-side redistribution structures 470 using arrays of microbump bonding structures 408. Optionally, underfill material portions (not illustrated) may be applied around each array of microbump bonding structures 408.

In some embodiments, at least one semiconductor die 415, such as an integrated passive device die or a surface mount die, may be bonded to each of the die-side redistribution structures 470.

Figure 5:
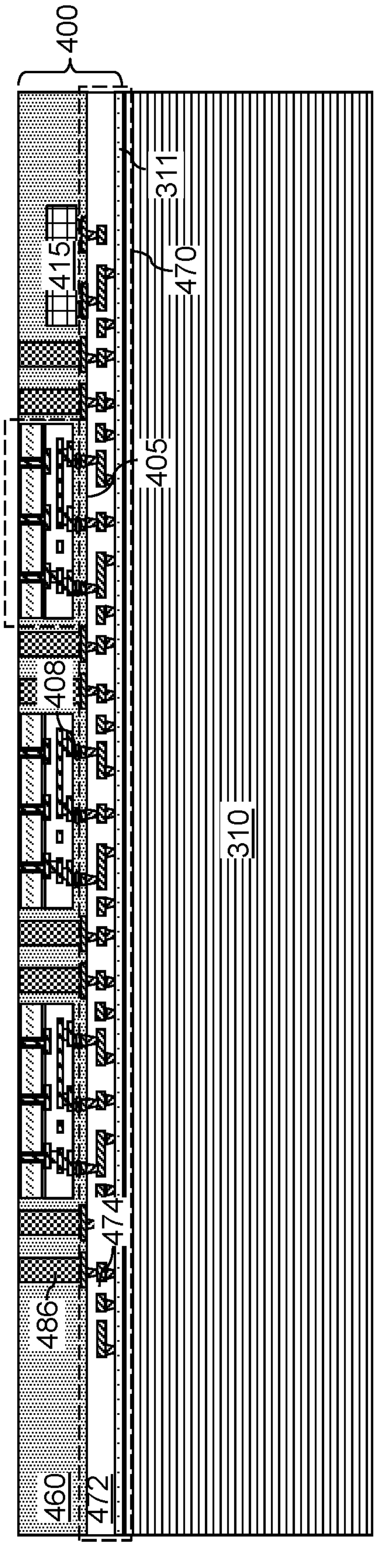
FIG. 5 is a vertical cross-sectional view of the exemplary structure after formation of molding compound interposer frames according to the embodiment of the present disclosure.

Referring to FIG. 5, an encapsulant, such as a molding compound (MC) may be applied to the gaps between the bridge dies 405 and the TIV structures 486. The MC includes an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC typically provides better handling, good flowability, less voids, better fill, and less flow marks. Solid MC typically provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability.

The MC may be cured at a curing temperature to form an MC matrix, which is herein referred to as a first MC matrix or an interposer-level MC matrix. In embodiments in which underfill material portions are used to laterally surround the array of microbump bonding structures 408, such underfill material portions may be incorporated into the first MC matrix. The first MC matrix laterally encloses each of the bridge dies 405 and the TIV structures 486. The first MC matrix may be a continuous material layer that extends across the entirety of the area of the reconstituted wafer overlying the first carrier wafer 310. As such, the first MC matrix may include a plurality of molding compound (MC) interposer frames 460 that are laterally adjoined to one another. Each MC interposer frame 460 corresponds to a portion of the first MC matrix located within a unit area, i.e., an area of a single interposer to be subsequently formed. Each MC interposer frame 460 may be located within a respective unit area, and laterally surrounds a respective set of at least one bridge die 405 and a respective array of TIV structures 486. Excess portions of the first MC matrix may be removed from above the horizontal plane including the top surfaces of the bridge die 405 and the TIV structures 486 by a planarization process, which may use chemical mechanical planarization (CMP). Surfaces of the through-silicon via structures 414 may be physically exposed after the planarization process.

A reconstituted wafer may be formed over the first carrier wafer 310. Each portion of the reconstituted wafer located within a unit area constitutes an interposer, which is herein referred to as a local-silicon-interconnect-containing interposer 400, or an LSI-containing interposer 400. Each LSI-containing interposer 400 comprises a set of at least one LSI bridge 405, a set of TIV structures 486, an MC interposer frame 460 (which is a portion of the first MC matrix), and a die-side redistribution structure 470.

Figure 6:
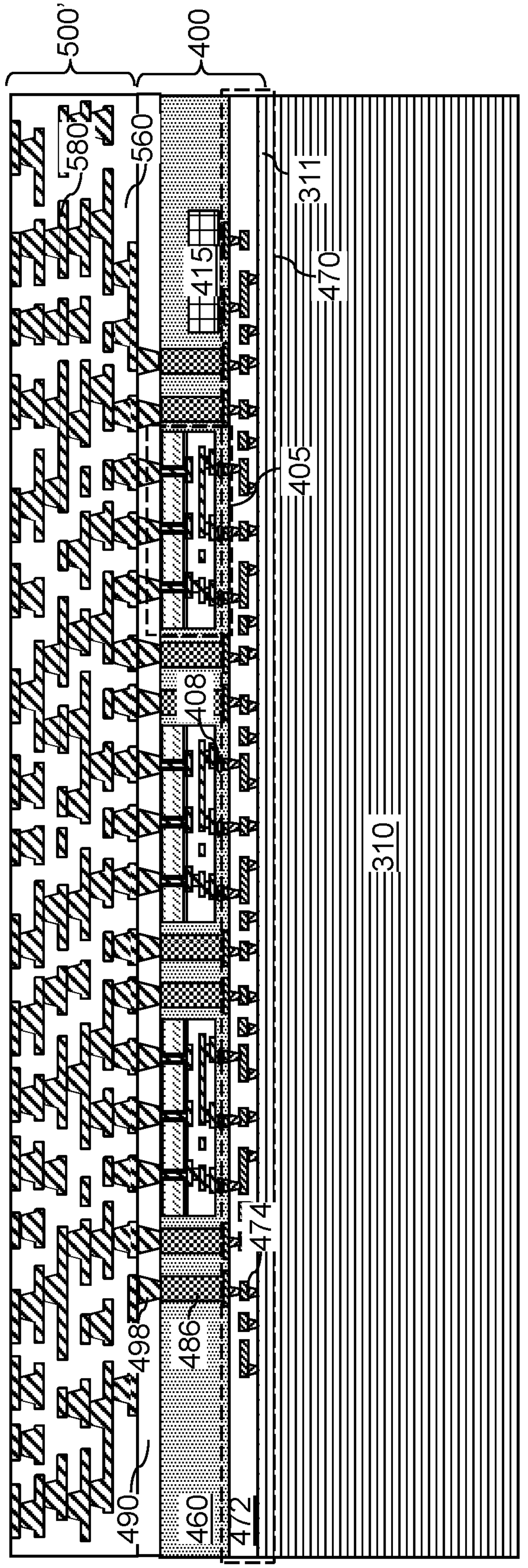
FIG. 6 is vertical cross-sectional view of the exemplary structure after attaching additional redistribution structures according to the embodiment of the present disclosure.

Referring to FIG. 6, an in-process package-side redistribution structure 500' may be formed on the two-dimensional array of LSI-containing interposers 400. As used herein, an "in-process" element refers to an element that is modified in a subsequent processing step, for example, by patterning, by change of material composition, and/or by addition or subtraction of a material portion. In embodiments in which the in-process package-side redistribution structure 500', additional structures may be added in subsequent processing steps.

A two-dimensional array of in-process package-side redistribution structures 500' may be transferred from another reconstituted wafer, and may be bonded to the two-dimensional array of LSI-containing interposers 400. For example, a dielectric material layer 490 can be formed over the MC interposer frame 460 by deposition of a dielectric material, which may comprise a polymer material. The polymer material of the dielectric material layer 490 may comprise any material that may be employed for the die-side redistribution dielectric layers 472. In one embodiment, the dielectric material layer 490 may comprise a filler material therein to provide increased mechanical strength during a subsequent bonding process. Via cavities can be formed through the dielectric material layer 490, and can be filled with a metallic bonding material such as copper to form metal via structures 498, which function as metallic bonding structures in subsequent processing steps. The dielectric material layer 490 and the metal via structures 498 are incorporated into the LSI-containing interposers 400. Each in-process package-side redistribution structures 500' may comprise an array of metallic bonding structures such as an array of copper bonding pads. The array of metallic bonding structures on each in-process package-side redistribution structure 500' may be arranged as a mirror image pattern of the pattern of the array of metal via structures 498 within a respective LSI-containing interposer 400. The array of the LSI-containing interposers 400 and the array of in-process package-side redistribution structures 500' may be subsequently boned to each other by inducing metal-to-metal bonding between the metal via structures 498 and metallic bonding structures within the in-process package-side redistribution structures 500'.

An in-process package-side redistribution structure 500' may be formed within each unit area, which is the area a repetition unit that may be repeated in a two-dimensional array as discussed above. The in-process package-side redistribution structure 500' may include first package-side redistribution dielectric layers 560 and first package-side redistribution wiring interconnects 580. The first package-side redistribution dielectric layers 560 may include any dielectric material that may be used for the die-side redistribution dielectric layers 472. The first package-side redistribution wiring interconnects 580 may include any material that may be used for the die-side redistribution wiring interconnects 474.

In an alternative embodiment, the in-process package-side redistribution structure 500' may be formed by repetition of a sequence of processing steps that includes a dielectric deposition step that deposits a package-side redistribution dielectric layer, a patterning step that forms openings through the package-side redistribution dielectric layer, a metal deposition step that deposits a metallic material layer (such as a copper layer), and a patterning step that patterns the metallic material layer into a respective subset of the first package-side redistribution wiring interconnects 580 formed at a respective level. In this embodiment, the set of processing steps used to form the die-side redistribution dielectric layers 472 and the die-side redistribution wiring interconnects 474 may be used mutatis mutandis, for example, with suitable changes in the pattern of material portions, material compositions, and/or material thicknesses.

Figure 7:
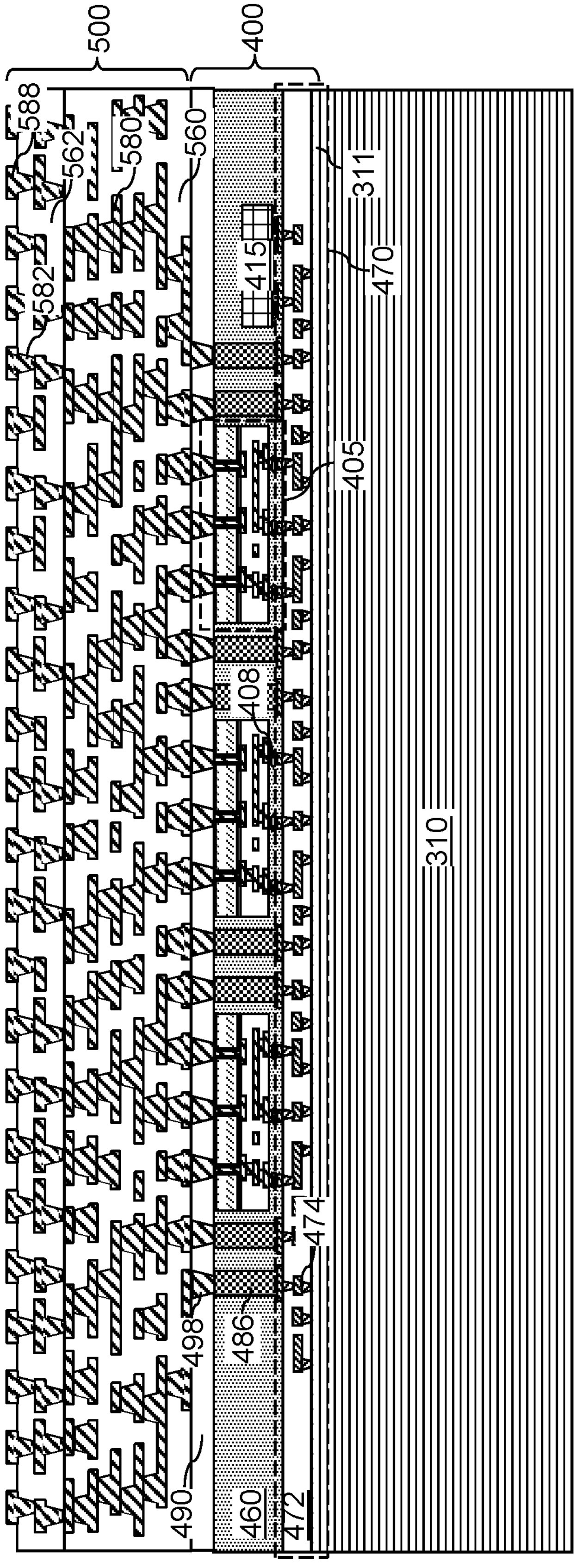
FIG. 7 is vertical cross-sectional view of the exemplary structure after formation of a composite interposer including a stack of an LSI-containing interposer and an organic interposer according to the embodiment of the present disclosure.

Referring to FIG. 7, at least one additional package-side redistribution dielectric layer (which is herein referred to as at least one second package-side redistribution dielectric layer 562) and additional package-side redistribution wiring interconnects (which are herein referred to as second package-side redistribution wiring interconnects 582) may be formed over the in-process package-side redistribution structure 500'. The at least one second package-side redistribution dielectric layer 562 and the second package-side redistribution wiring interconnects 582 may be formed by performing a sequence of processing steps at least once. The sequence of processing steps includes a dielectric deposition step that deposits a package-side redistribution dielectric layer, a patterning step that forms openings through the package-side redistribution dielectric layer, a metal deposition step that deposits a metallic material layer (such as a copper layer), and a patterning step that patterns the metallic material layer into a respective subset of the first package-side redistribution wiring interconnects 580 formed at a respective level.

The first package-side redistribution dielectric layer 560 and the at least one second package-side redistribution dielectric layer 562 are collectively referred to as package-side redistribution dielectric layers (560, 562). The first package-side redistribution wiring interconnects 580 and the second package-side redistribution wiring interconnects 582 are collectively referred to as package-side redistribution wiring interconnects (580, 582). Interposer-side bonding pads 588 may be formed at the topmost level of the package-side redistribution dielectric layers (560, 562). In one embodiment, the interposer-side bonding pads 588 may be formed as a two-dimensional array of interposer-side bonding pads 588, which may be a periodic array such as a rectangular array or a hexagonal array. Generally, the pitches of the two-dimensional array of interposer-side bonding pads 588 along horizontal directions may be in a range from 20 microns to 100 microns, although lesser and greater pitches may also be used. For example, the pitches of the two-dimensional array of interposer-side bonding pads 588 may be in a range from 20 microns to 60 microns, although lesser and greater pitches may also be used.

The total number of layers among the package-side redistribution dielectric layers (560, 562) may be in a range from 1 to 30, although a greater number of layers may also be used. The total number of levels among the package-side redistribution wiring interconnects (580, 582) may be in a range from 1 to 30, although a greater number of levels may also be used.

The reconstituted wafer after the processing steps of FIG. 6 comprises the package-side redistribution dielectric layers (560, 562), the package-side redistribution wiring interconnects (580, 582), the interposer-side bonding pads 588, and a two-dimensional array of LSI-containing interposers 400. Each LSI-containing interposer 400 is located within a respective unit area, which is the area of a unit of repetition within the reconstituted wafer. Each portion of the set of materials including the package-side redistribution dielectric layers (560, 562), the package-side redistribution wiring interconnects (580, 582), and the interposer-side bonding pads 588 located within a unit area constitutes an organic interposer 500. The thickness of the organic interposer may be in a range from 1 micron to 1 mm, although a greater thickness may also be used. Each contiguous vertical stack of an LSI-containing interposer 400 and an organic interposer 500 constitutes a composite interposer (400, 500). Thus, the reconstituted wafer may include a two-dimensional array of composite interposers (400, 500). Each LSI-containing interposer 400 contains at least one local silicon interconnect (LSI) bridge 405.

Figure 8:
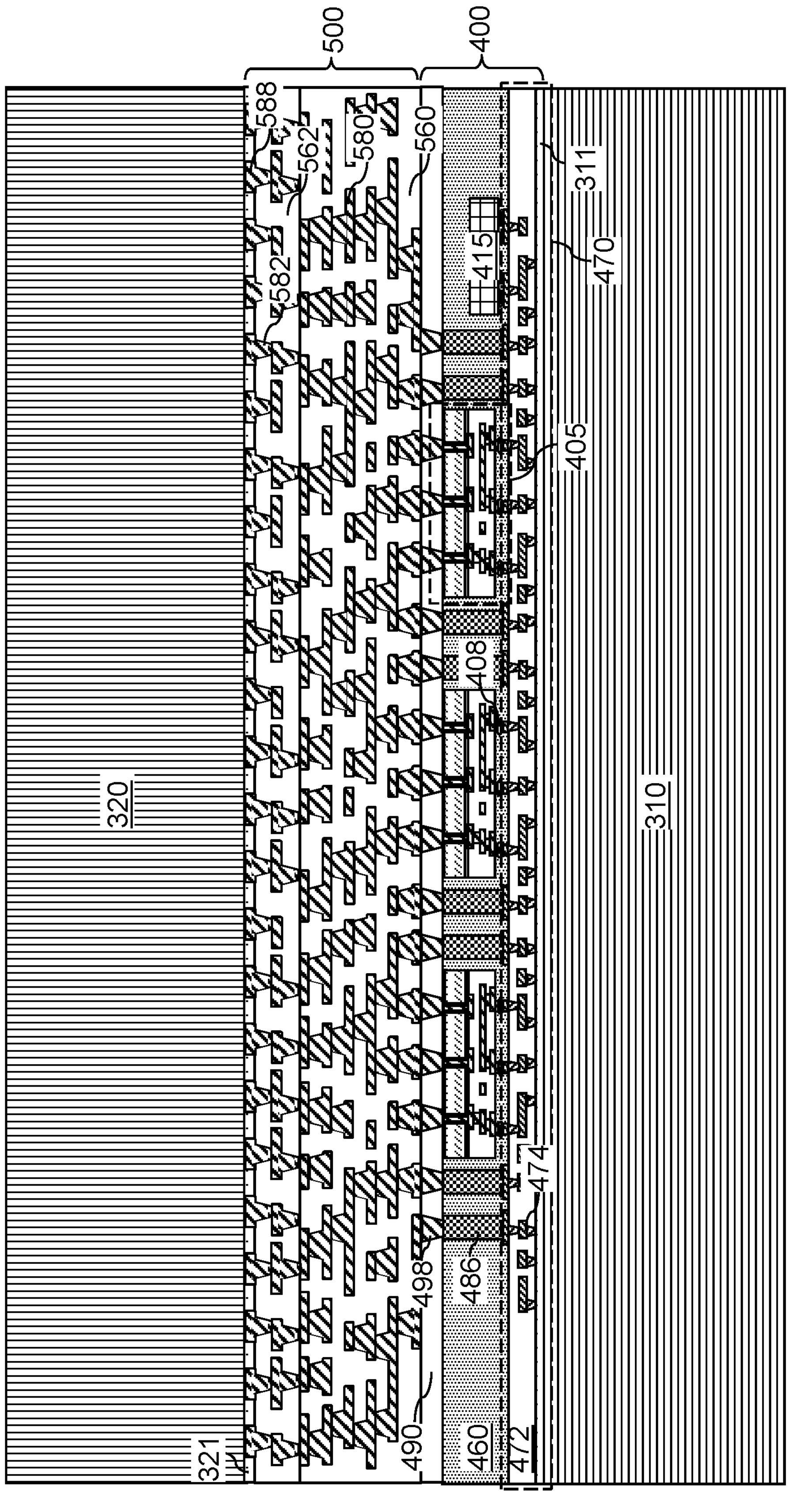
FIG. 8 is a vertical cross-sectional view of the exemplary structure after attachment of a second carrier wafer to the composite interposer according to the embodiment of the present disclosure.

Referring to FIG. 8, a second adhesive layer 321 may be applied over the package-side redistribution dielectric layers (560, 562). The second adhesive layer 321 may comprise a light-to-heat conversion (LTHC) layer or a thermally decomposing adhesive material layer depending on the removal mechanism to be subsequently used. A second carrier wafer 320 may be attached to the die-side redistribution structure 470 through the second adhesive layer 321. The second carrier wafer 320 may comprise any material that may be used for the first carrier wafer 310, and generally may have about the same thickness range as the first carrier wafer 310.

Figure 9:
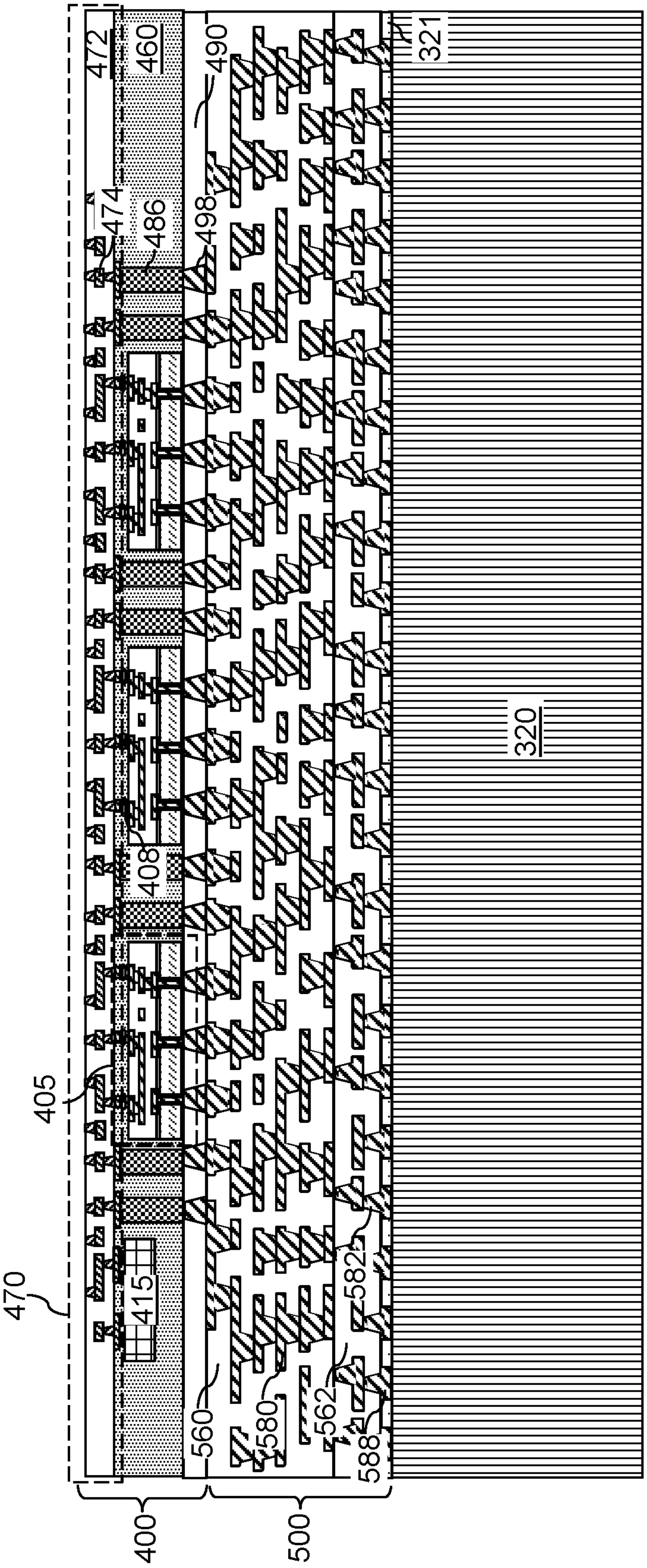
FIG. 9 is a vertical cross-sectional view of the exemplary structure after detaching the first carrier wafer according to the embodiment of the present disclosure.

Referring to FIG. 9, the first carrier wafer 310 may be detached from the reconstituted wafer. In some embodiments, the first carrier wafer 310 and the first adhesive layer 311 may be removed by backside grinding. Optionally, at least one selective etch process (such as a wet etch process or a reactive ion etch process) may be used in conjunction with the backside grinding process to minimize collateral removal of surface portions of the composite interposers (400, 500). Alternatively or additionally, in embodiments in which the first carrier wafer 310 includes an optically transparent material and the first adhesive layer 311 comprises a light-to-heat conversion material, irradiation through the first carrier wafer 310 may be used to detach the first carrier wafer 310. In embodiments in which the first adhesive layer 311 comprises a thermally decomposable adhesive material, an anneal process or a laser irradiation may be used to detach the first carrier wafer 310. A suitable clean process may be performed to remove residual portions of the first adhesive layer 311.

On-interposer bump structures 478 may be formed on the top surface of the composite interposers (400, 500). The on-interposer bump structures 478 are bump structures that may be subsequently used to attach semiconductor dies. The metallic fill material for the on-interposer bump structures 478 may include copper. The on-interposer bump structures 478 may have horizontal cross-sectional shapes of rectangles, rounded rectangles, or circles. Other horizontal cross-sectional shapes may be within the contemplated scope of disclosure. Typically, the on-interposer bump structures 478 may be configured for microbump bonding (i.e., C2 bonding), and may have a thickness in a range from 30 microns to 100 microns, although lesser or greater thicknesses may also be used. In such an embodiment, the on-interposer bump structures 478 may be formed as an array of microbumps (such as copper pillars) having a lateral dimension in a range from 10 microns to 25 microns, and having a pitch in a range from 20 microns to 50 microns. Generally, the pitches of the on-interposer bump structures 478 may be smaller than the pitches of the two-dimensional array of interposer-side bonding pads 588 by a factor in a range from 1.2 to 10, such as from 2 to 5.

Figure 10A:
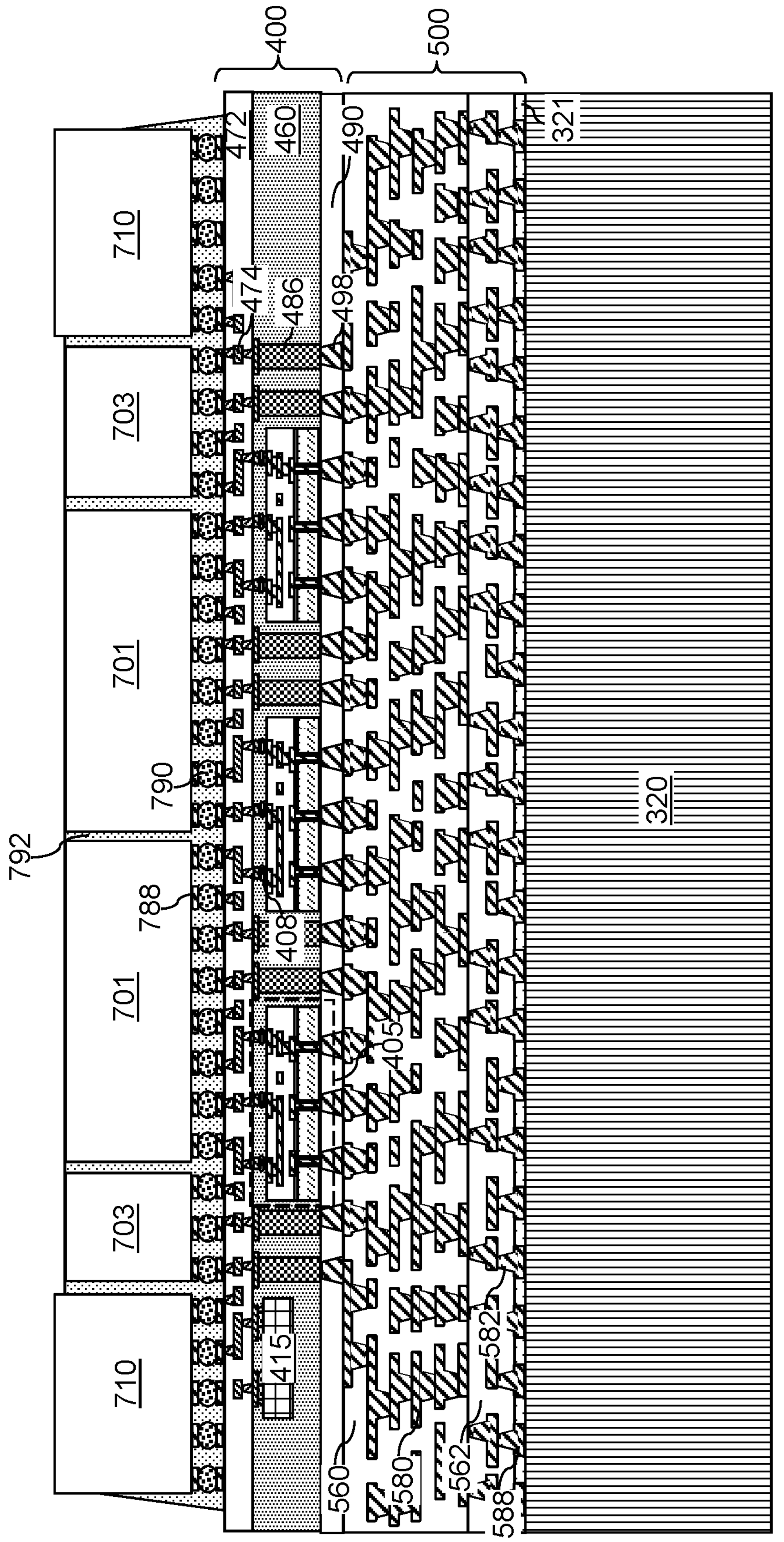
FIG. 10A is a vertical cross-sectional view of the exemplary structure after attaching semiconductor dies and spacer dies to the composite interposer according to the embodiment of the present disclosure.
Figure 10B:
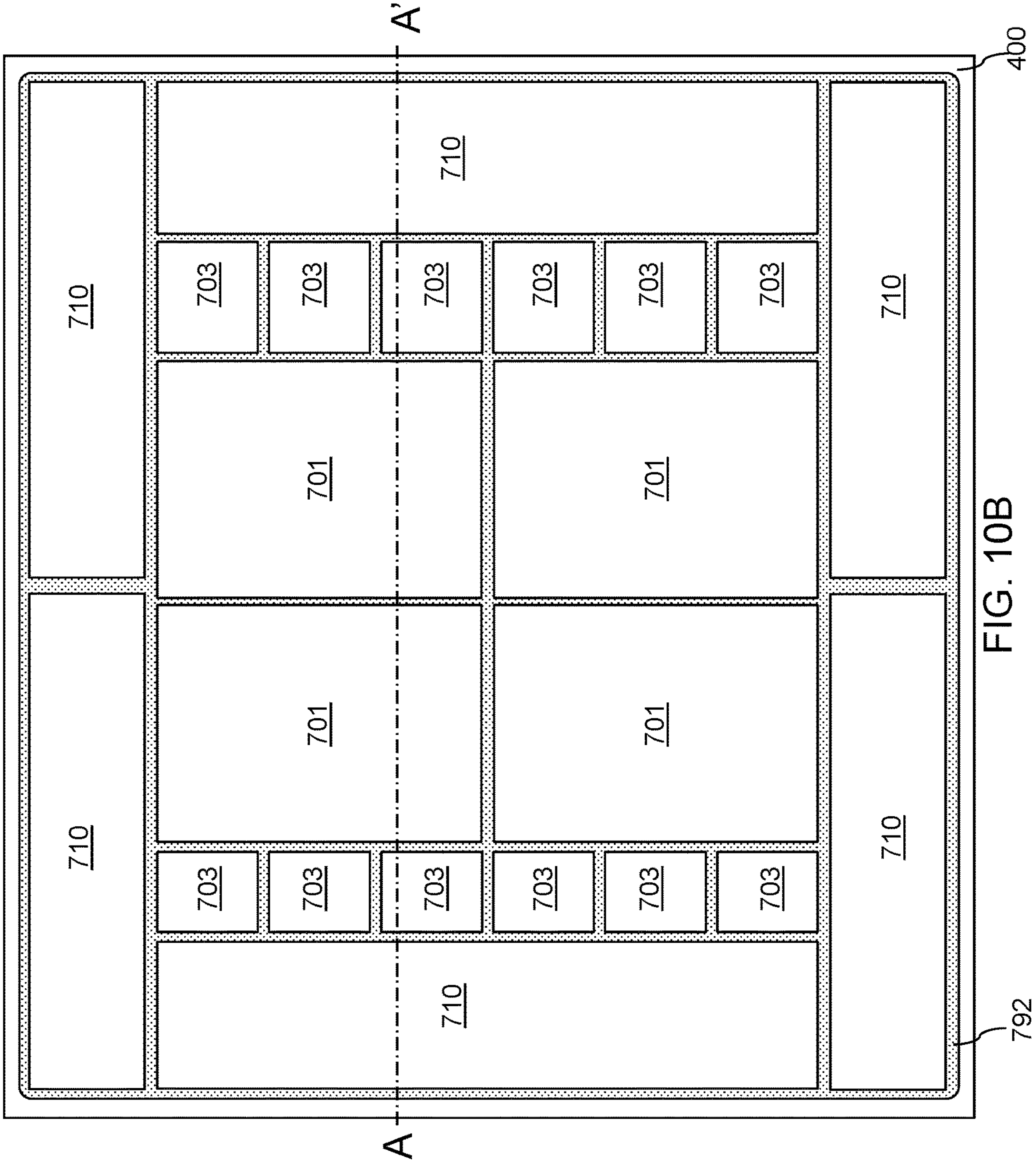
FIG. 10B is a top-down view of the exemplary structure of FIG. 10A. The vertical plane A-A' is the plane of the vertical cross-sectional view of FIG. 10A.
Figure 11A:
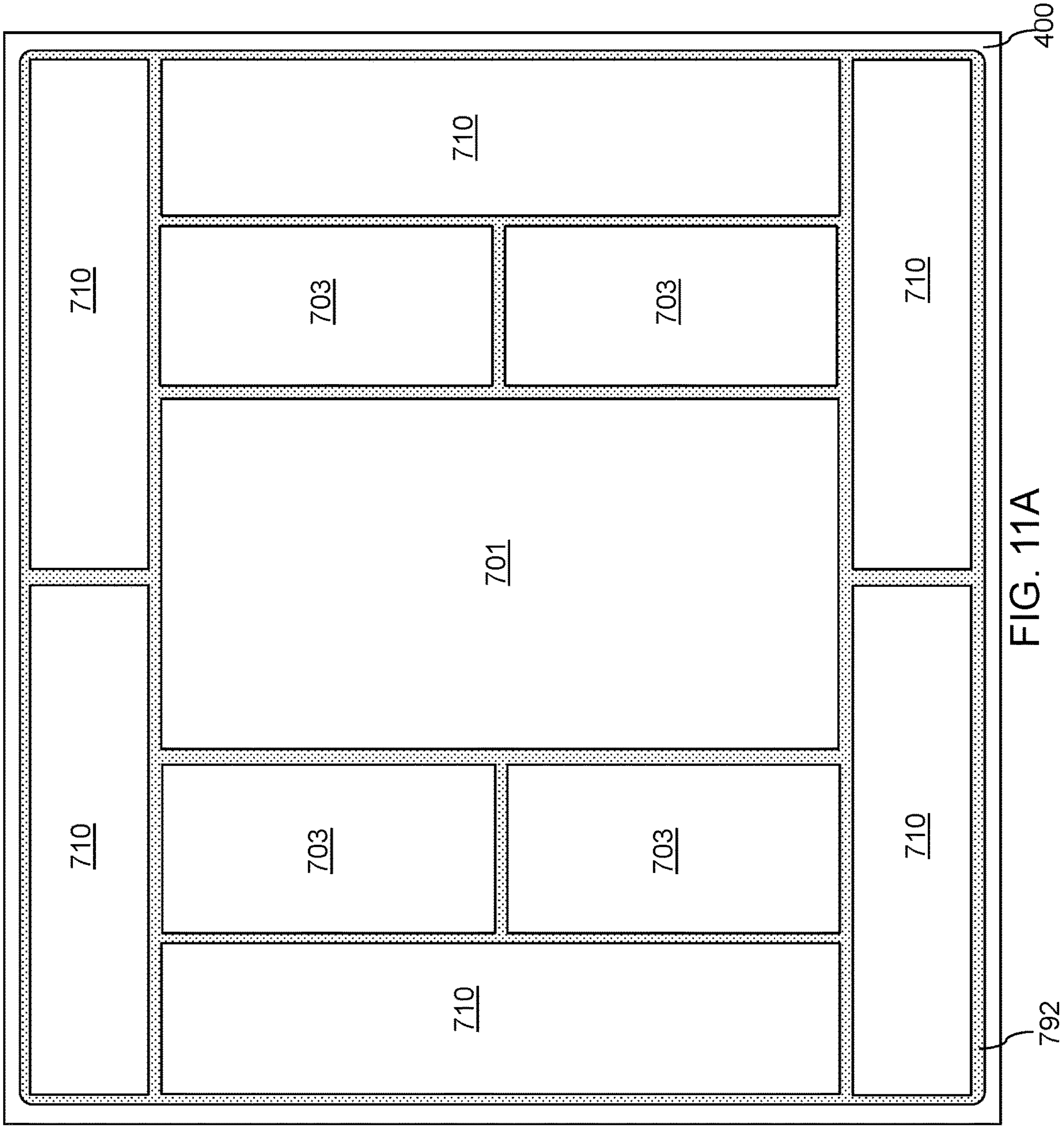
FIGS. 11A-11G are top-down views of alternative configuration of the exemplary structure at a processing step that corresponds to the processing step of FIGS. 10A and 10B.
Figure 11B:
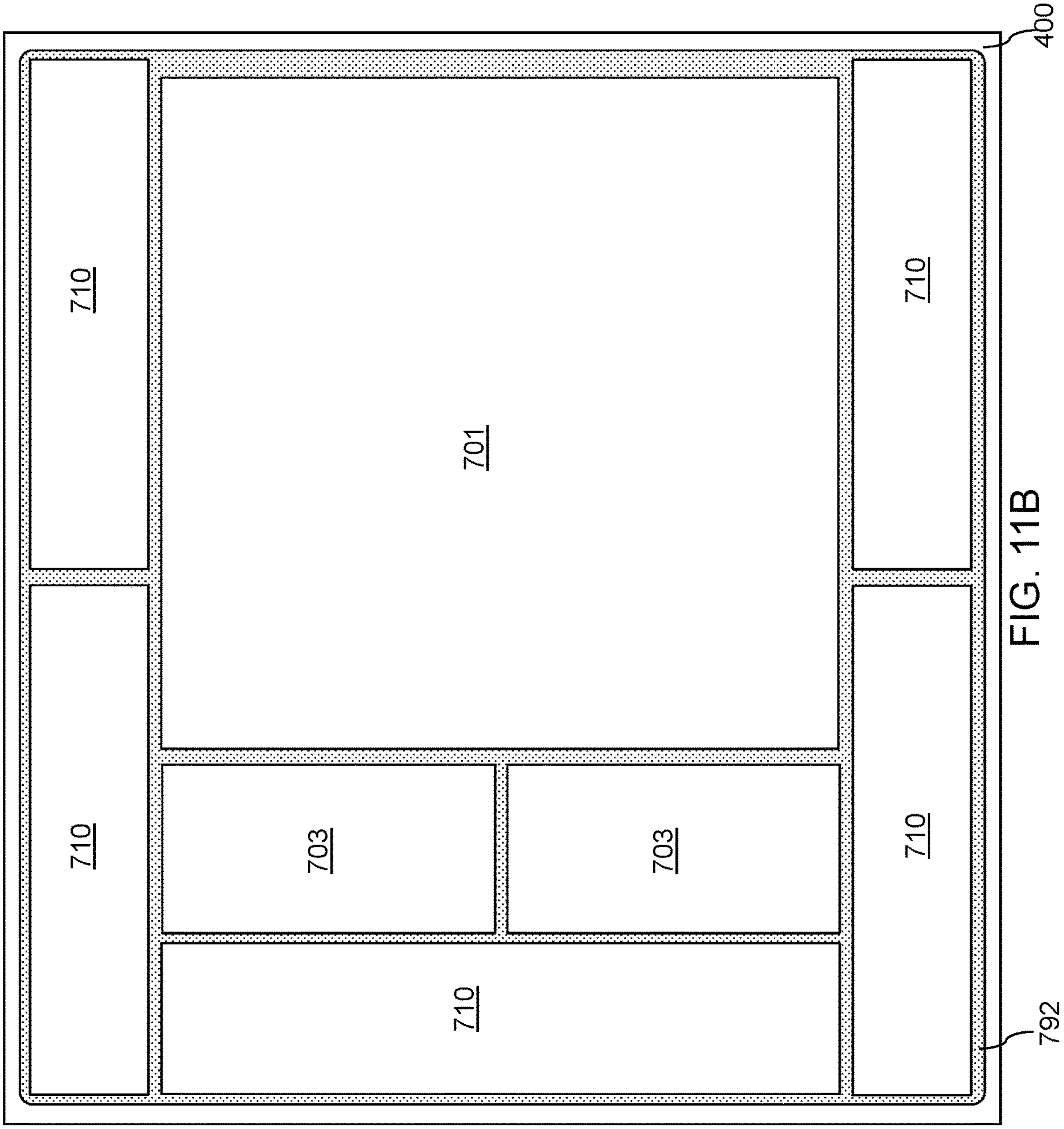
Figure 11C:
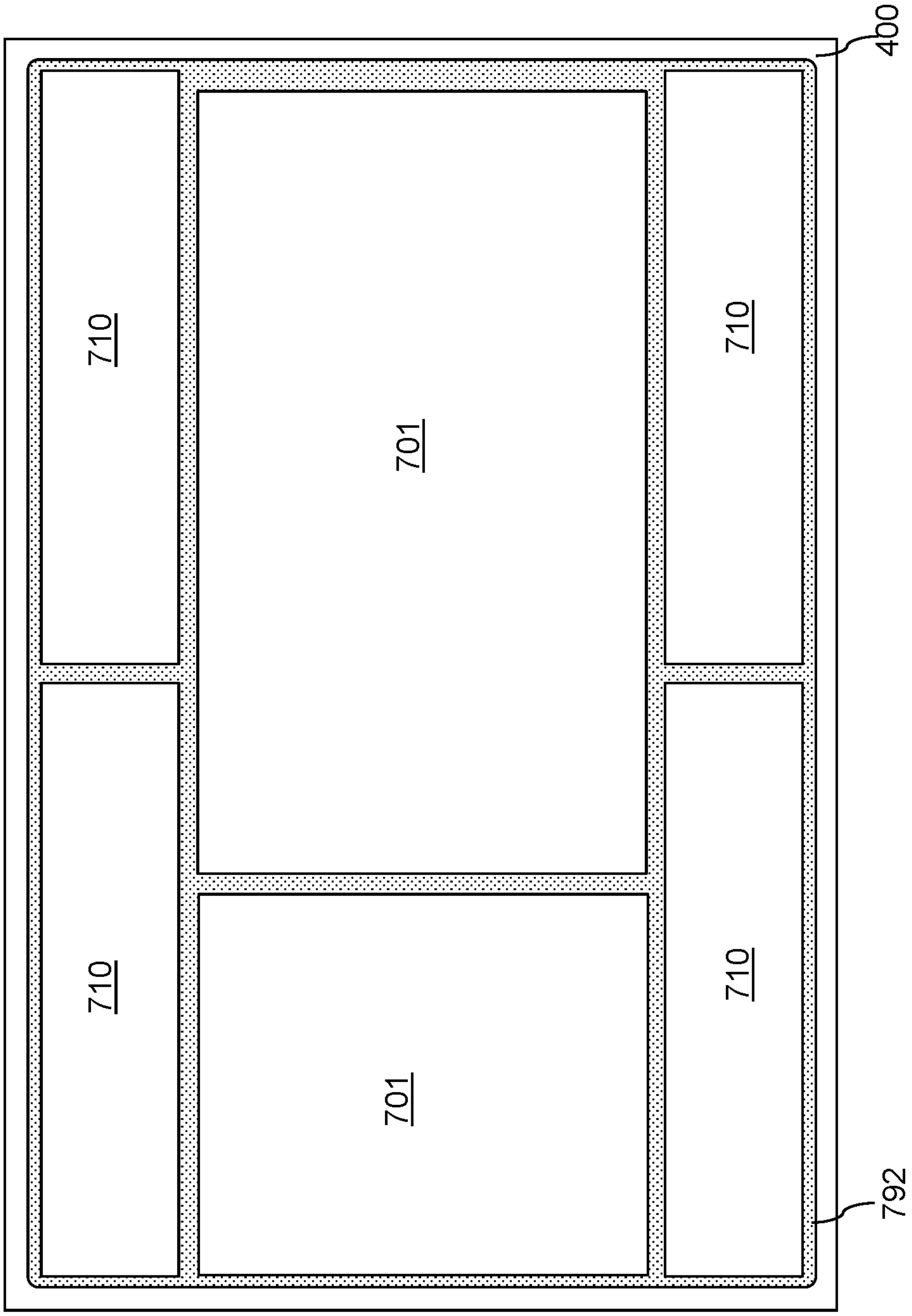
Figure 11D:
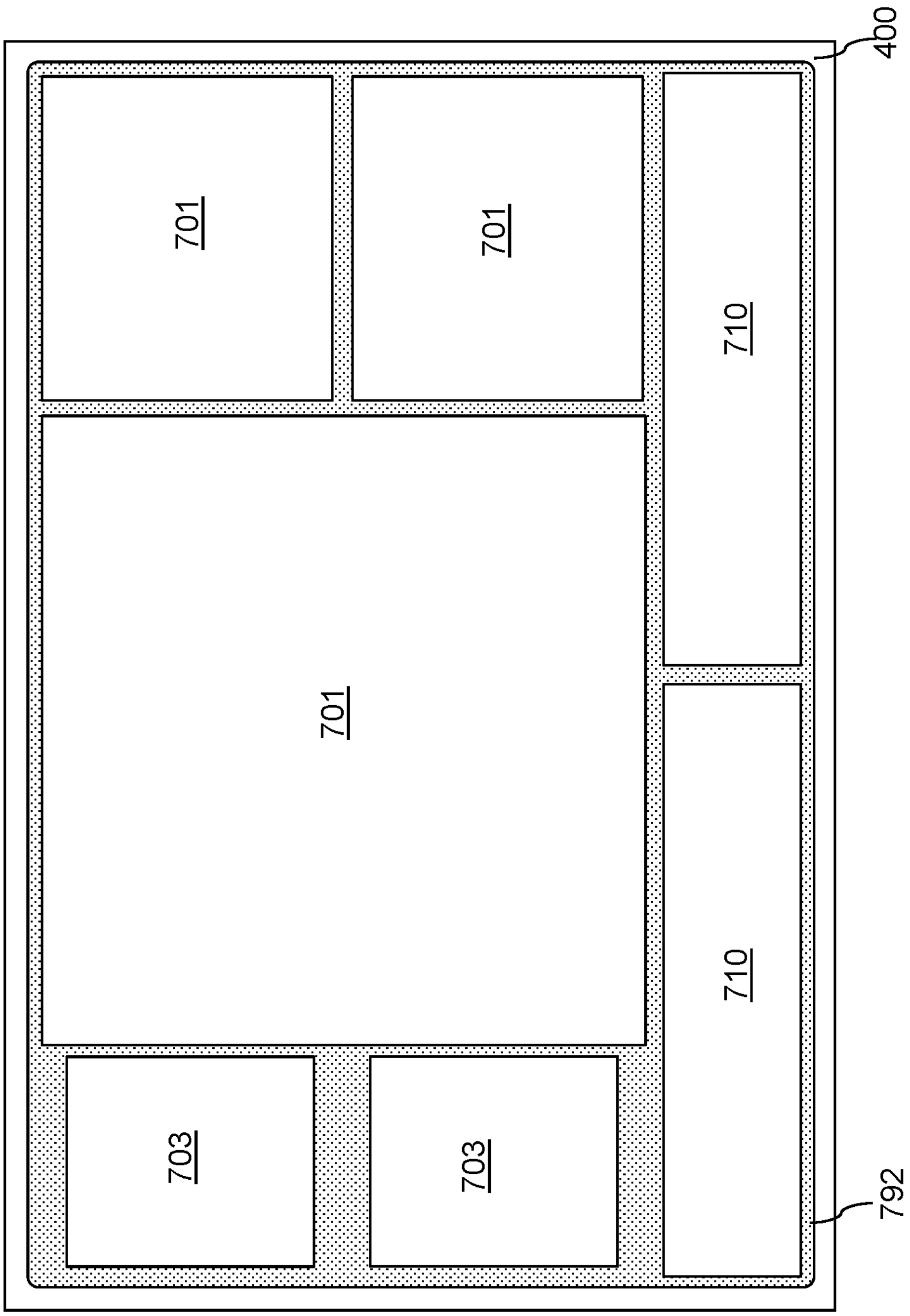
Figure 11E:
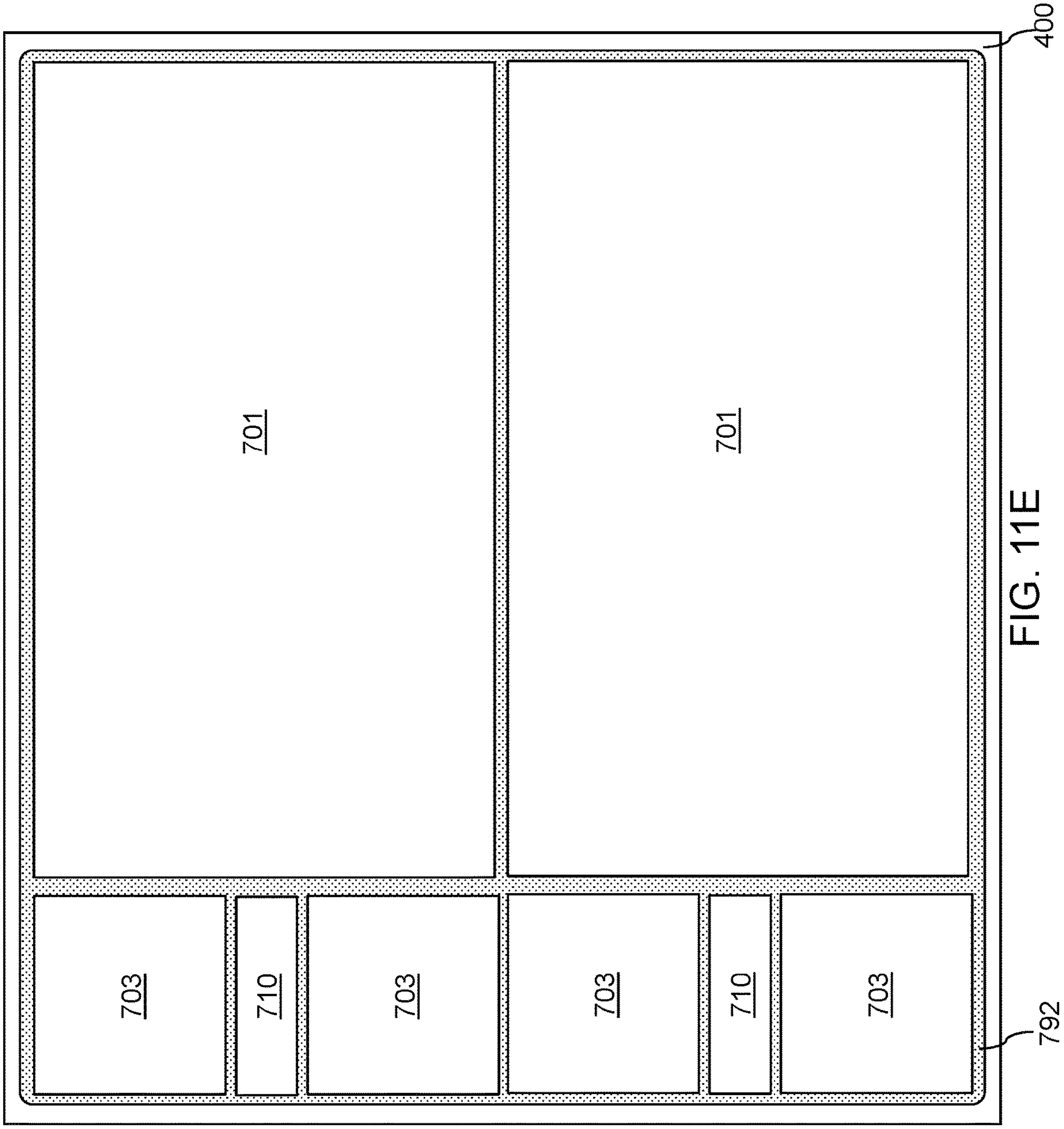
Figure 11F:
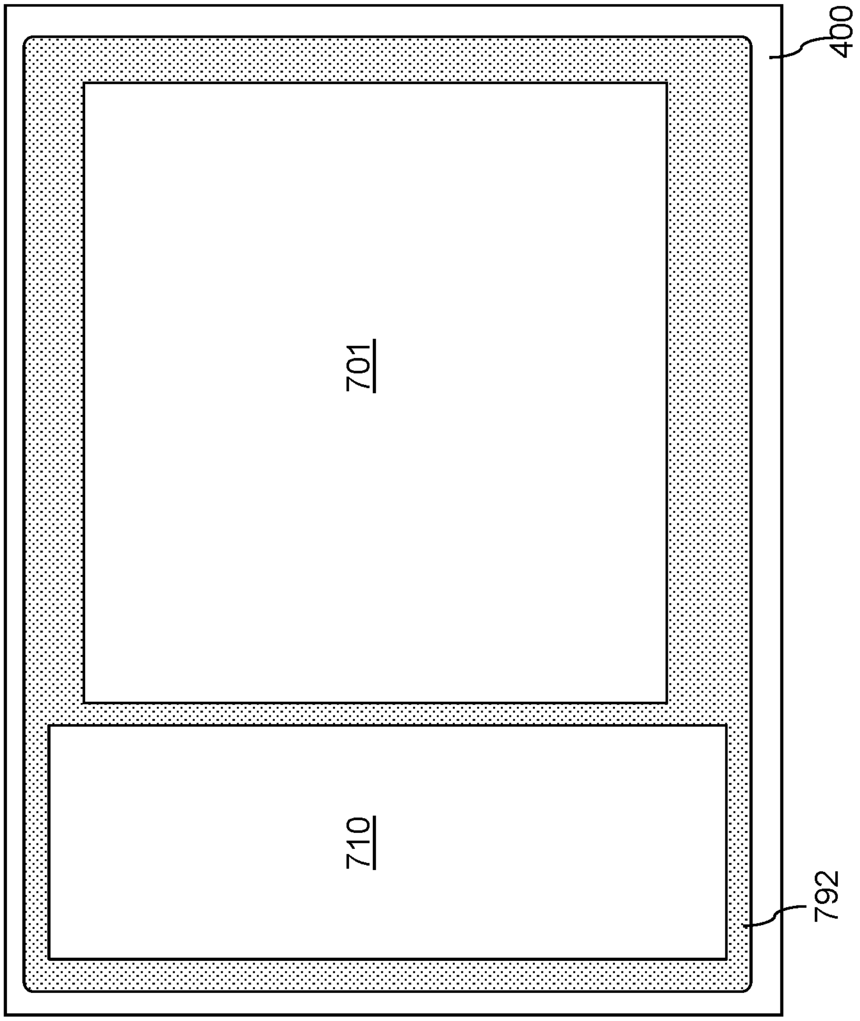
Figure 11G:
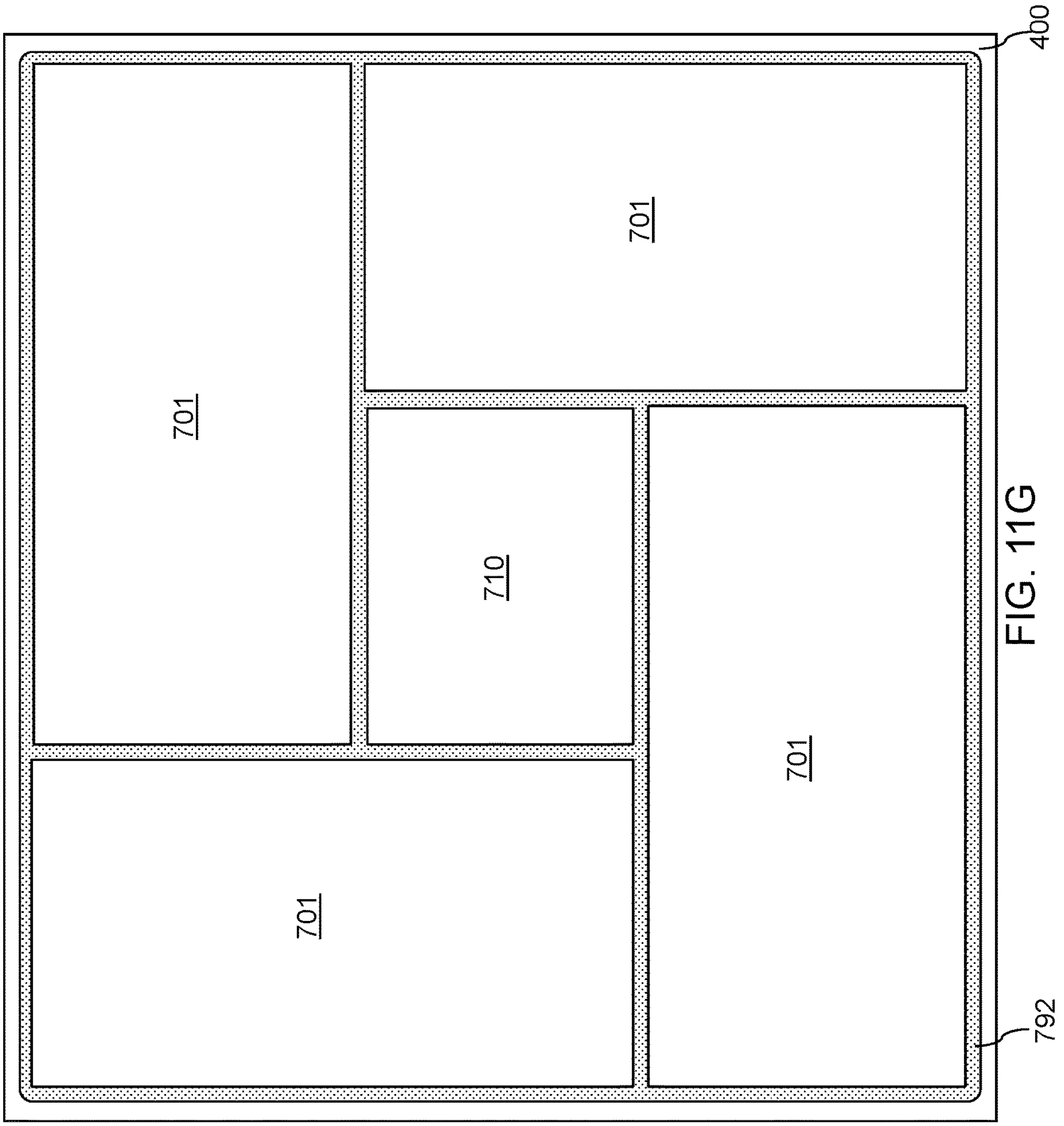

Referring to FIGS. 10A and 10B, a set of at least one semiconductor die (701, 703) and a set of at least one spacer die 710 may be attached to each composite interposer (400, 500). In one embodiment, the composite interposers (400, 500) may be arranged as a two-dimensional periodic array within the reconstituted wafer in the exemplary structure, and multiple sets of at least one semiconductor die (701, 703) may be bonded to the composite interposers (400, 500) as a two-dimensional periodic rectangular array of sets of the at least one semiconductor die (701, 703). In this embodiment, multiple sets of at least one spacer die 710 may be bonded to the composite interposers (400, 500) as a two-dimensional periodic rectangular array of sets of at least one spacer die 710. Each set of at least one semiconductor die (701, 703) includes at least one semiconductor die (701, 703), which may, or may not, be a plurality of semiconductor dies (701, 703). Each set of at least one spacer die 710 includes at least one spacer die 710, which may, or may not, be a plurality of spacer dies 710.

The semiconductor dies (701, 703) and the spacer dies differ from each other based on presence or absence of transistors therein. Each of semiconductor die (701, 703) comprises a respective set of transistors and a respective set of metal interconnect structures therein. Each spacer die 710 is free from any transistor therein. As used herein, a transistor may be any transistor such as a field effect transistor of any configuration, a junction transistor (such as a bipolar junction transistor), a thin film transistor, or any other type of transistor including three or more electrodes. A spacer die 710 may, or may not, include metal interconnect structures therein. Thus, each of the at least one semiconductor die (701, 703) comprises a respective set of transistors and a respective set of metal interconnect structures.

In one embodiment, each set of at least one semiconductor die (701, 703) may comprise a plurality of semiconductor dies (701, 703). For example, each set of at least one semiconductor die (701, 703) may include at least one system-on-chip (SoC) die 701 and/or at least one memory die 703. In other words, the at least one semiconductor die (701, 703) bonded to a respective composite interposer (400, 500) may comprise one or more system-on-a-chip (SoC) die 701 and one or more memory dies 703. Each SoC die 701 may comprise an application processor die, a central processing unit die, or a graphic processing unit die. In one embodiment, the at least one memory die 703 may comprise a high bandwidth memory (HBM) die that includes a vertical stack of static random access memory dies. In one embodiment, the at least one semiconductor die (701, 703) may include at least one system-on-chip (SoC) die 701 and at least one high bandwidth memory (HBM) die. Each HBM die may comprise a vertical stack of static random access memory (SRAM) dies that are interconnected to one another through arrays of microbumps and are laterally surrounded by a respective molding material enclosure frame.

Each semiconductor die (701, 703) may comprise a respective array of on-die bump structures 788. Solder material portions may be applied to the on-die bump structures 788 of the semiconductor dies (701, 703), or may be applied to the on-interposer bump structures 478. The solder material portions are herein referred to as die-interposer-bonding (DIB) solder material portions 790, or as solder material portions 790. Each of the semiconductor dies (701, 703) may be positioned in a face-down position such that on-die bump structures 788 face the on-interposer bump structures 478. Placement of the semiconductor dies (701, 703) may be performed using a pick and place apparatus such that each of the on-die bump structures 788 may face a respective one of the on-interposer bump structures 478. Each set of at least one semiconductor die (701, 703) may be placed within a respective unit area. A DIB solder material portion 790 is attached to one of the on-die bump structure 788 and the on-interposer bump structure 478 for each facing pair of an on-die bump structure 788 and an on-interposer bump structure 478.

Each of the at least one spacer 710 that is bonded to a respective one of the composite interposers (400, 500) may have a respective configuration that may be selected from various configurations. In one embodiment, one, a plurality, and/or each, of the at least one spacer die 710 that is bonded to a composite interposer (400, 500) comprises a bulk material portion that continuously extends from a bottom surface of the one, the plurality, and/or each, of the at least one spacer die 710 to a top surface of the one, the plurality, and/or each, of the at least one spacer die 710. In one embodiment, one, a plurality, and/or each, of the at least one spacer die 710 that is bonded to a composite interposer (400, 500) consists essentially of on-die bump structures 788, optional metal interconnect structures embedded therein, and the bulk material portion that continuously extends from a bottom surface of the one, the plurality, and/or each, of the at least one spacer die 710 to a top surface of the one, the plurality, and/or each, of the at least one spacer die 710. In one embodiment, each of the bulk material portions may comprise, and/or may consist essentially of, a material selected from a polymer material, organosilicate glass, silicon oxide, silicon nitride, and a dielectric metal oxide.

In one embodiment, one, a plurality, and/or each, of the at least one spacer die 710 that is bonded to a composite interposer (400, 500) comprises a redistribution die including a set of redistribution wiring interconnects and redistribution dielectric layers comprising a polymer material. As used herein, a redistribution die refers to a die that includes redistribution structures. The redistribution structures include a combination of redistribution dielectric layers and redistribution wiring interconnects. The redistribution dielectric layers in each redistribution die may include any material that may be used for the first package-side redistribution dielectric layers 560 as discussed above. The redistribution wiring interconnects in each redistribution die may include any material that may be used for the first package-side redistribution wiring interconnects 580 as discussed above.

In one embodiment, one, a plurality, and/or each, of the at least one spacer die 710 that is bonded to a composite interposer (400, 500) comprises at least one passive device component selected from a resistor, a capacitor, and an inductor, or comprises an electrostatic discharge (ESD) circuit containing at least one diode. As discussed above, each spacer die 710 is free of transistors.

Generally, a plurality, and/or each, of the at least one spacer die 710 may, or may not, include metal interconnect structures (including redistribution wiring interconnects) therein. Each spacer die 710 may comprise a respective array of on-die bump structures 788. Solder material portions may be applied to the on-die bump structures 788 of the spacer dies 710, or may be applied to the on-interposer bump structures 478. The solder material portions are herein referred to as die-interposer-bonding (DIB) solder material portions 790, or as first solder material portions. Each of the spacer dies 710 may be positioned in a face-down position such that on-die bump structures 788 face the on-interposer bump structures 478. Placement of the spacer dies 710 may be performed using a pick and place apparatus such that each of the on-die bump structures 788 may face a respective one of the on-interposer bump structures 478. Each set of at least one spacer die 710 may be placed within a respective unit area. A DIB solder material portion 790 is attached to one of the on-die bump structure 788 and the on-interposer bump structure 478 for each facing pair of an on-die bump structure 788 and an on-interposer bump structure 478.

In one embodiment, a plurality of composite interposers (400, 500) may be located on the second carrier wafer 320, and at least one semiconductor die (701, 703) may be bonded to a first subset of the on-interposer bump structures 478 in each composite interposer (400, 500) through first solder material portions 790. Each of the at least one semiconductor die (701, 703) comprises a respective set of transistors and a respective set of metal interconnect structures. At least one spacer die 710 may be bonded to a second subset of the on-interposer bump structures 478 in each composite interposer (400, 500) through second solder material portions 790. Each of the at least one spacer die 710 does not include any transistor therein. In some embodiments, one or more spacer die 710 that is bonded to a composite interposer (400, 500) may protrude higher than a horizontal plane including a top surface of a semiconductor die (701, 703) that is bonded to the composite interposer (400, 500).

In one embodiment, the on-die bump structures 788 and the on-interposer bump structures 478 may be configured for microbump bonding (i.e., C2 bonding). In this embodiment, each of the on-die bump structures 788 and the on-interposer bump structures 478 may be configured as copper pillar structures having a diameter in a range from 10 microns to 30 microns, and may have a respective height in a range from 5 microns to 100 microns. The pitch of the microbumps in the direction of periodicity may be in a range from 20 microns to 60 microns, although lesser and greater pitches may also be used. Upon reflow, the lateral dimensions of each DIB solder material portion 790 may be in a range from 100% to 150% of the lateral dimension (such as a diameter) of the adjoined on-die bump structure 788 or of the adjoined on-interposer bump structure 478.

Generally, a composite interposer (400, 500) may be provided, which includes interposer bump structure 478 thereupon. At least one semiconductor die (701, 703) may be provided, each of which includes a respective set of on-die bump structures 788. The at least one semiconductor die (701, 703) may be bonded to the composite interposer (400, 500) using the DIB solder material portions 790 that are bonded to a respective on-interposer bump structure 478 and to a respective on-die bump structure 788. Each set of at least one semiconductor die (701, 703) may be attached to a respective composite interposer (400, 500) through a respective set of DIB solder material portions 790.

A die-side underfill material may be applied into each gap between a respective composite interposer (400, 500) and a respective set of all dies (701, 703, 710) that are bonded to the respective composite interposer (400, 500). Each set of all dies (701, 703, 710) that are bonded to a composite interposer (400, 500) includes a respective set of at least one semiconductor die (701, 703) and a respective set of at least one spacer die 710. The die-side underfill material may comprise any underfill material known in the art. A die-side underfill material portion 792 may be formed within each unit area between a composite interposer (400, 500) and an overlying set of dies (701, 703, 710). The die-side underfill material portions 792 may be formed by injecting the die-side underfill material around a respective array of DIB solder material portions 790 in a respective unit area. Any known underfill material application method may be used, which may be, for example, the capillary underfill method, the molded underfill method, or the printed underfill method.

Within each unit area, a die-side underfill material portion 792 may laterally surround, and contact, a respective set of the DIB solder material portions 790 within the unit area. The die-side underfill material portion 792 may be formed around, and contact, the DIB solder material portions 790, the on-interposer bump structures 478, and the on-die bump structures 788 in the unit area. Generally, at least one semiconductor die (701, 703) comprising a respective set of on-die bump structures 788 is attached to the on-interposer bump structures 478 through a respective set of DIB solder material portions 790 within each unit area. In one embodiment, a die-side underfill material portion 792 may laterally surround all of the on-interposer bump structures 478 and the on-die bump structures 788 within a respective unit area. In one embodiment, a underfill material portion 792 may extend as a single continuous structure around, and laterally surrounding each of, the first solder material portions 790 attached to each semiconductor die (701, 703) and the second solder material portions 790 attached to each spacer die 710 within each unit area.

FIGS. 11A-11G are top-down views of alternative configuration of the exemplary structure at a processing step that corresponds to the processing step of FIGS. 10A and 10B.

Generally, a set of dies (701, 703, 710) that is attached to a composite interposer (400, 500) includes a set of at least one semiconductor die (701, 703) and a set of at least one spacer die 710. The set of at least one semiconductor die (701, 703) may be a set of a single semiconductor die (701 or 703) or a set of a plurality of semiconductor dies (701, 703). The set of at least one spacer die 710 may be a set of a single spacer die 710 or a set of a plurality of spacer dies 710. Over each composite interposer (400, 500), the set of at least one semiconductor die (701, 703) and the set of at least one spacer die 710 may be arranged in any configuration. While FIGS. 11A-11G illustrate some exemplary configurations, the illustrated configurations are only exemplary and the present disclosure is not limited by any specific geometry illustrated in FIGS. 11A-11G. In some embodiments, each of the at least one semiconductor die (701, 703) overlying a composite interposer (400, 500) is laterally spaced from vertical planes defining a boundary of the composite interposer (400, 500) by a respective one of the plurality of spacer dies 710.

In an illustrative example, the total number of spacer dies 710 in a fan-out package 800 may be in a range from 1-40, although more spacer dies 710 may also be used. The total number of memory dies 703 in a fan-out package 800 may be in a range from 1-40, although more memory dies 703 may also be used. The total number of SoC dies 701 in a fan-out package 800 may be in a range from 1-40, although more SoC dies 701 may also be used.

Generally, a spacer die 710 may be positioned on any side of a semiconductor die (701, 703). Each of the spacer dies 710 may has any horizontal cross-sectional shape having a closed periphery. Thus, each of the spacer dies 710 may have a respective horizontal cross-sectional shape of a rectangle, a square, a triangle, an oval, a circle, a polygon, or any other curvilinear two-dimensional shape having a closed periphery. Generally, each spacer die 710 may comprise, and/or may consist of, one or more materials selected from at least one metallic material, at least one dielectric material, at least one semiconductor material, and at least one organic material. The lateral extent of each spacer die 710 along a first horizontal direction of a first periodicity of the composite interposers (400, 500) and/or along a second horizontal direction of a second periodicity of the composite interposers (400, 500) may be in a range from 1 mm to 100 nm, although lesser and greater lateral extents may also be used. The height of each spacer die 710 may be substantially the same as, or may be greater than, the height of the semiconductor dies (701, 703), and may be in a range from 100 microns to 1 mm, although lesser and greater heights may also be used.

Figure 12:
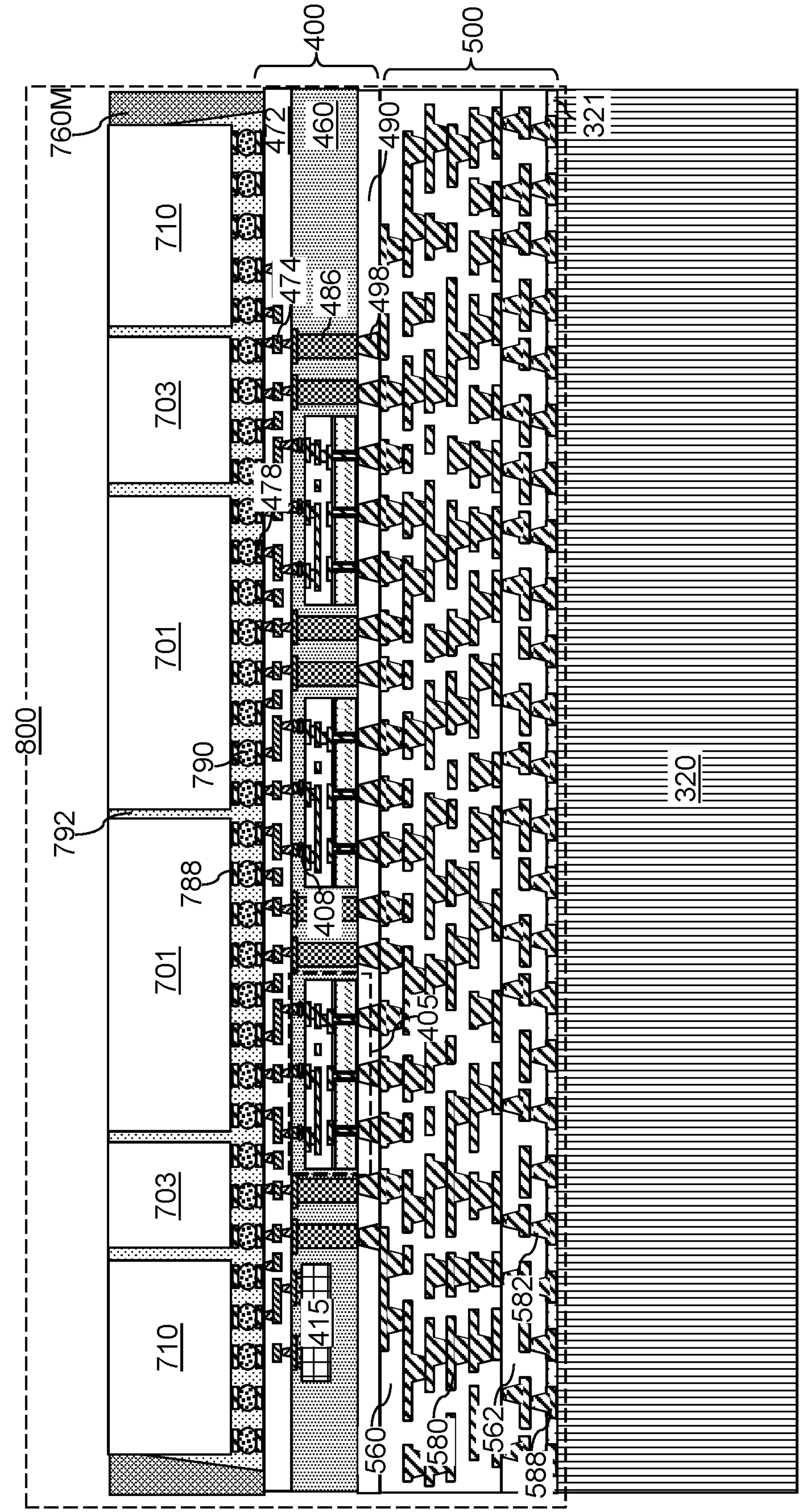
FIG. 12 is a vertical cross-sectional view of the exemplary structure after formation of a molding compound die matrix according to the embodiment of the present disclosure.

Referring to FIG. 12, a molding compound (MC) may be applied to the gaps between assemblies of a respective set of dies (701, 703, 710) and a respective die-side underfill material portion 792. The MC may include any material that may be used for the MC interposer frames 460 discussed above. The MC may include epoxy resin, hardener, silica (as a filler material), and other additives. The MC may be cured at a curing temperature to form an MC matrix, which is herein referred to as a die-level MC matrix 760M or as a second MC matrix. The die-level MC matrix 760M laterally surrounds and embeds each assembly of a set of at least one semiconductor die (701, 703), a set of at least one spacer die 710, and a die-side underfill material portion 792. The die-level MC matrix 760M includes a plurality of molding compound (MC) die frames that may be laterally adjoined to one another. Each MC die frame is a portion of the die-level MC matrix 760M that is located within a respective unit area. Thus, each MC die frame laterally surrounds, and embeds, a respective a set of semiconductor dies (701, 703) and a respective die-side underfill material portion 792. Young's modulus of pure epoxy is about 3.35 GPa, and Young's modulus of the MC may be higher than Young's modulus of pure epoxy due to additives therein. Thus, Young's modulus of the die-level MC matrix 760M may be greater than 3.5 GPa.

Portions of the die-level MC matrix 760M that overlies the horizontal plane including the top surfaces of the semiconductor dies (701, 703) may be removed by a planarization process. For example, the portions of the die-level MC matrix 760M that overlies the horizontal plane may be removed using a chemical mechanical planarization (CMP). In embodiments in which one or more spacer dies 710 protrude above semiconductor dies (701, 703), protruding portions of such spacer dies 710 may be removed from above a horizontal plane including top surfaces of the semiconductor dies (701, 703). In one embodiment, the die-level molding compound die matrix 760M and one or more of the spacer dies 710 within each unit area may be planarized such that each of the semiconductor dies (701, 703) and the spacer dies 710 has a respective horizontal surface located within a planarized horizontal surface of the planarized die-level molding compound die matrix 760M. Generally, the planarization process may be performed such that all top surfaces of the semiconductor dies (701, 703), all top surfaces of the spacer dies 710, and the top surface of the die-level MC matric 760M (as polished) are formed within a same horizontal plane.

The reconstituted wafer that overlies the second carrier wafer 320 comprises a combination of the die-level MC matrix 760M, the semiconductor dies (701, 703), the spacer dies 710, the die-side underfill material portions 792, and the two-dimensional array of composite interposers (400, 500). Each portion of the die-level MC matrix 760M located within a unit area constitutes an MC die frame.

Generally, a die-level molding compound die matrix 760M may be formed over a plurality of composite interposers (400, 500). The die-level molding compound die matrix 760M comprises a plurality of molding compound die frames overlying a respective one of the plurality of interposers (400, 500). Each molding compound die frame is a portion of the die-level molding compound die matrix 760 having an areal overlap with a composite interposer (400, 500) in a plan view. Each molding compound die frame laterally surrounds at least one respective semiconductor die (701, 703) and at least one respective spacer die 710 within a respective unit area.

Each portion of the reconstituted wafer located within a unit area constitutes a fan-out package 800. Each fan-out package 800 may comprise at least one semiconductor die (701, 703), a composite interposer (400, 500), DIB solder material portions 790, at least one die-side underfill material portion 792, and an MC die frame that is a portion of the die-level MC matrix 760M located within a respective unit area.

Figure 13:
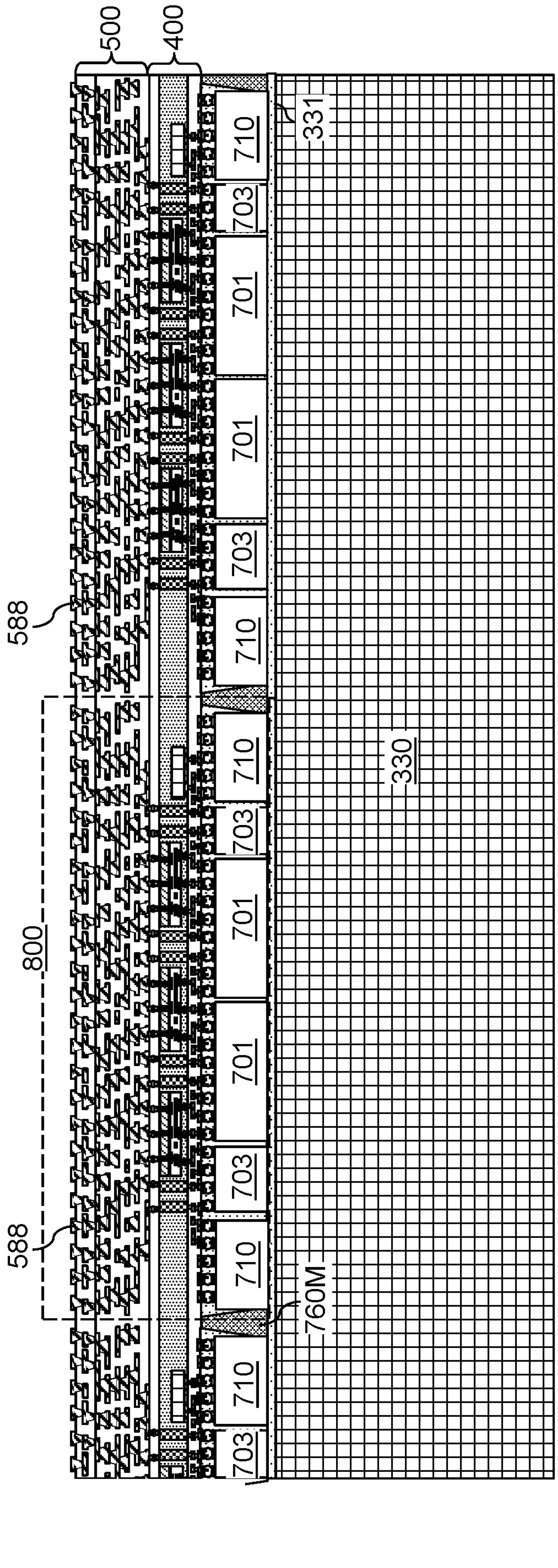
FIG. 13 is a vertical cross-sectional view of the exemplary structure after attaching a third carrier substrate, and detaching the second carrier substrate according to an embodiment of the present disclosure.

Referring to FIG. 13, a third adhesive layer 331 may be applied on the die-level MC matrix 760M. The third adhesive layer 331 may comprise a light-to-heat conversion (LTHC) layer or a thermally decomposing adhesive material layer depending on the removal mechanism to be subsequently used. A third carrier wafer 330 may be attached to the die-level MC matrix 760M through the third adhesive layer 331. The third carrier wafer 330 may comprise any material that may be used for the first carrier wafer 310, and generally may have about the same thickness range as the first carrier wafer 310.

The second carrier wafer 320 may be detached from the a reconstituted wafer. In an embodiment, the second carrier wafer 320 may include an optically transparent material and the second adhesive layer 321 comprises a light-to-heat conversion material, irradiation through the second carrier wafer 320 may be used to detach the second carrier wafer 320. In embodiments in which the second adhesive layer 321 comprises a thermally decomposable adhesive material, an anneal process or a laser irradiation may be used to detach the second carrier wafer 320. A suitable clean process may be performed to remove residual portions of the second adhesive layer 321. The interposer-side bonding pads 588 of the composite interposers (400, 500) may be physically exposed.

Figure 14:
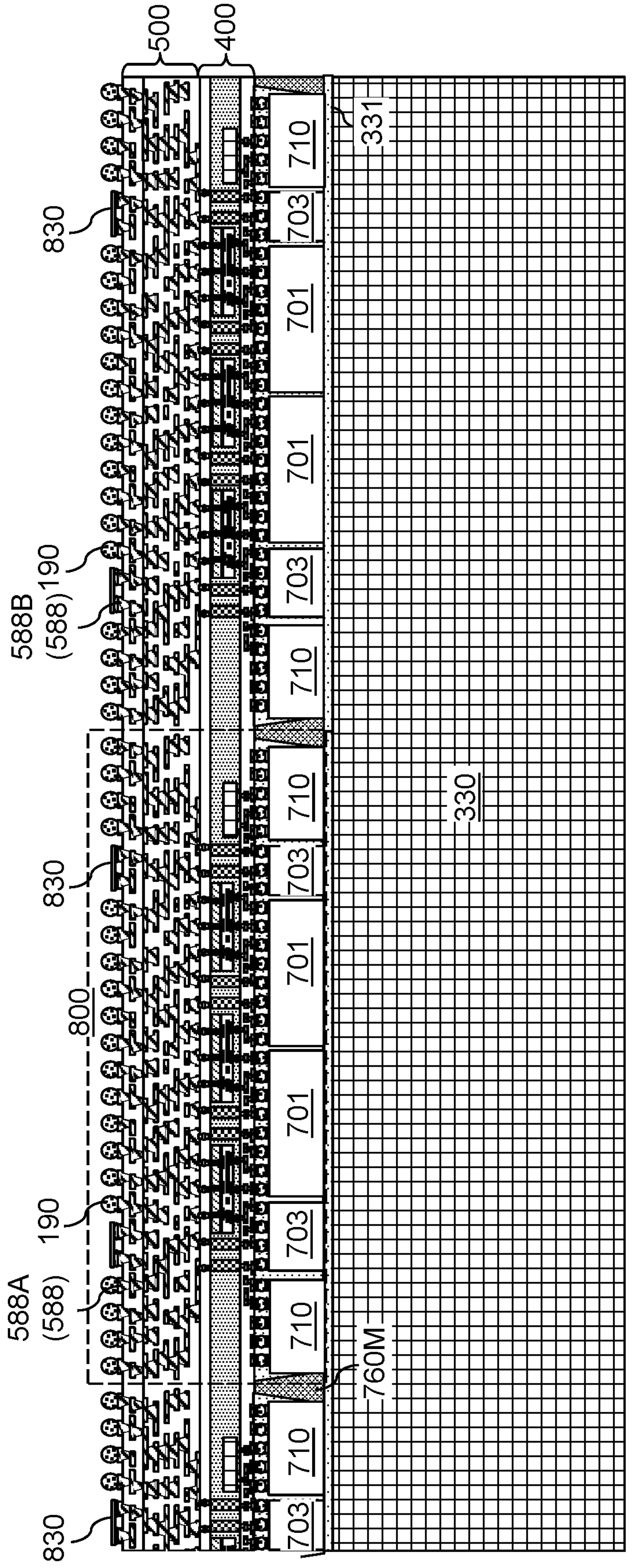
FIG. 14 is a vertical cross-sectional view of the exemplary structure after attaching solder material portions and surface mount dies according to an embodiment of the present disclosure.

Referring to FIG. 14, solder joints 190 may be attached to a first subset of the interposer-side bonding pads 588, which are herein referred to as first interposer-side bonding pads 588A. The solder joints 190 may comprise any solder material that may be subsequently reflowed to provide a solder connection between two metal bonding pads. In one embodiment, the solder joints 190 may be formed as a ball grid array (BGA). In such an embodiment, each of the solder joints 190 may have a diameter in a range from 100 microns to 3,000 microns, may have a pitch in a range from 100 microns to 3,000 microns, and may have a pitch in a range from 200 microns to 6,000 microns, although lesser and greater diameters, heights, and pitches may also be used.

In one embodiment, surface mount dies 830 may be attached to a subset of the interposer-side bonding pads 588, which is herein referred to as second interposer-side bonding pads 588B. The surface mount dies 830 may comprise any type of surface mount die that is known in the art. In an illustrative example, the surface mount dies 830 may comprise capacitor dies, inductor dies, resistor dies, etc. The total number of the surface mount dies 830 may be in a range from 0 to 5,000, such as from 16 to 1,024, although a greater number of surface mount dies 830 may also be used. In one embodiment, the thickness of the at least one surface mount die 830 may be greater than 20 microns, and/or greater than 40 microns, and/or greater than 70 microns, and/or greater than 100 microns.

The reconstituted wafer located over the third carrier substrate comprises a two-dimensional array of fan-out packages 800. Generally, an in-process structure including an interposer (400, 500) may be provided. In the illustrated example, the in-process structure may comprise a fan-out package 800 that includes a composite interposer (400, 500), a set of at least one semiconductor die (701, 703) and a set of at least one spacer die 710 that are bonded to the composer interposer (400, 500) and laterally surrounded by, and encapsulated by, a molding compound die frame (which is a portion of the die-level molding compound die matrix 760 located within an area of a respective compound interposer (400, 500) in a plan view (i.e., a top-down view). The composite interposer (400, 500) may include first interposer-side bonding pads 588A and second interposer-side bonding pads 588B. At least one surface mount die 830 may be bonded to the second interposer-side bonding pads 588B. Each of at least one surface mount die 830 is bonded to a respective set of the second interposer-side bonding pads 588 located on the composite interposer (400, 500) through a respective array of second interposer-side solder material portions.

Figure 15A:
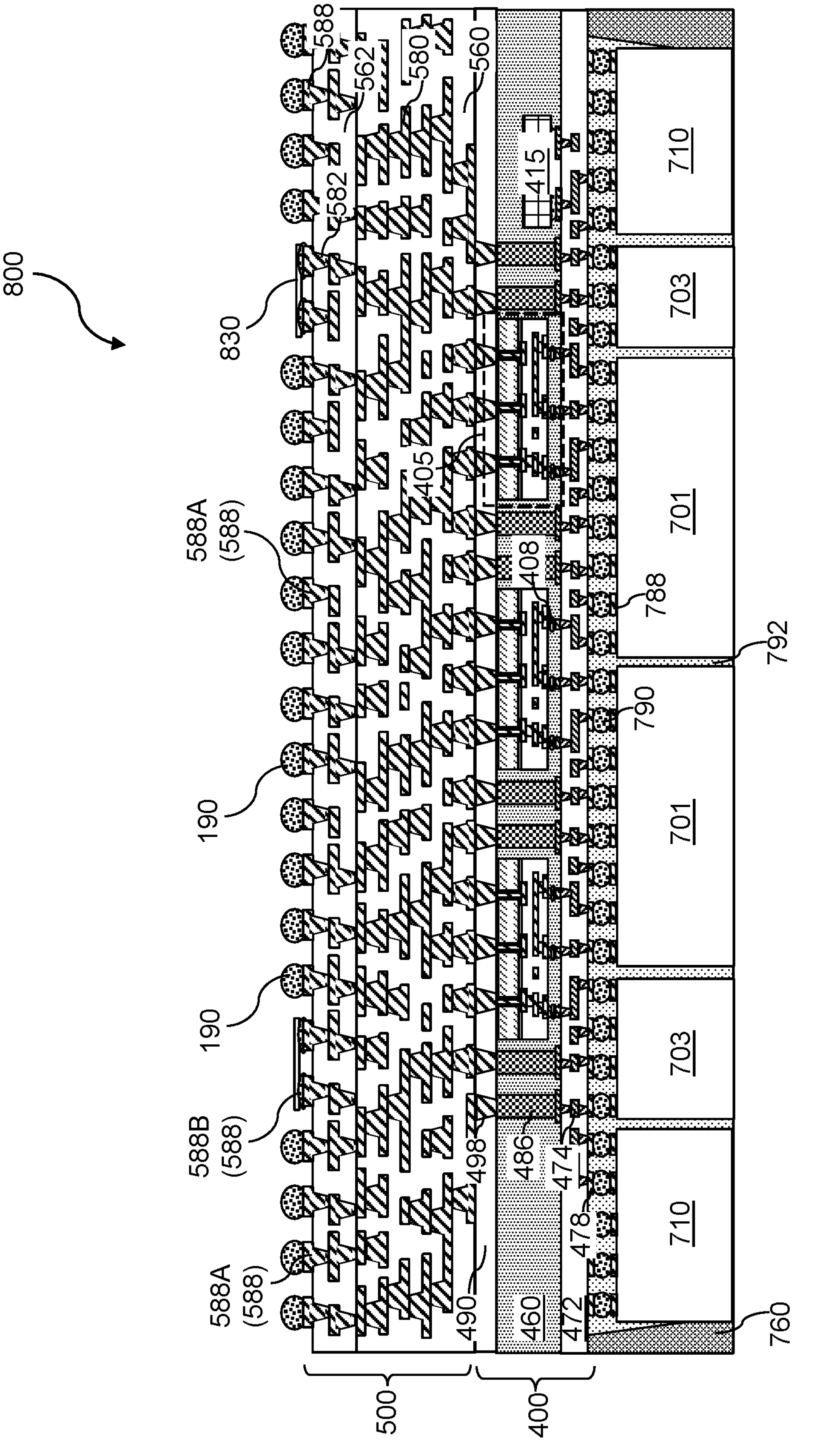
FIG. 15A is a vertical cross-sectional view of a fan-out package obtained by dicing the exemplary structure of FIG. 14.
Figure 15B:
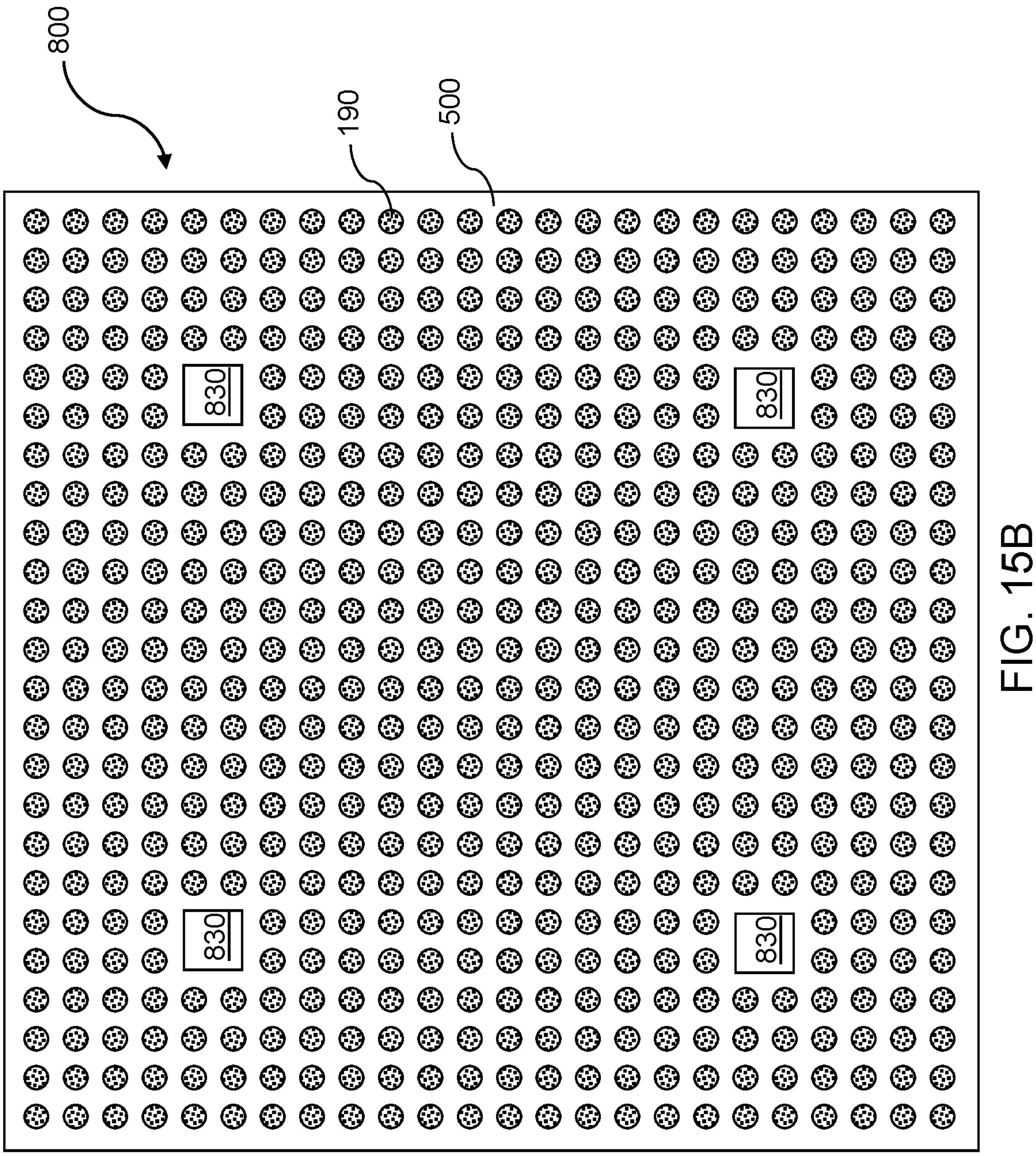
FIG. 15B is a top-down view of the fan-out package of FIG. 15A.

Referring to FIGS. 15A and 15B, the third carrier wafer 330 may be detached from the reconstituted wafer that includes a combination of the plurality of interposers (400, 500), semiconductor dies (701, 703), spacer dies 710, and the die-level molding compound die matrix 760M. In embodiments in which the third carrier wafer 330 includes an optically transparent material and the third adhesive layer 331 comprises a light-to-heat conversion material, irradiation through the third carrier wafer 330 may be used to detach the third carrier wafer 330. In embodiments in which the third adhesive layer 331 comprises a thermally decomposable adhesive material, an anneal process or a laser irradiation may be used to detach the third carrier wafer 330. A suitable clean process may be performed to remove residual portions of the third adhesive layer 331. A horizontal surface of the die-level MC matrix 760M may be physically exposed.

The reconstituted wafer includes a two-dimensional array of composite interposers (400, 500), a two-dimensional array of sets of at least one semiconductor die (701, 703) that are bonded to a respective composite interposer (400, 500), and a two-dimensional array of sets of at least one spacer die 710 that are attached to a respective composite interposer (400, 500). The reconstituted wafer may be diced along dicing channels by performing a dicing process. The dicing channels correspond to the boundaries between neighboring pairs of unit areas. Each diced unit from the reconstituted wafer comprises a fan-out package 800 to which integrated passive devices 830 may be optionally attached. In other words, each diced portion of a two-dimensional array of fan-out packages 800 comprises a fan-out package 800. Each diced portion of the die-level MC matrix 760M constitutes a molding compound die frame 760, i.e., an MC die frame 760.

In one embodiment, each of the fan-out packages 800 comprises at least one respective semiconductor die (701, 703), at least one respective spacer die 710, a respective molding compound die frame 760, and a respective composite interposer (400, 500). In one embodiment, outer sidewalls of each composite interposer (400, 500) and sidewalls of the molding compound die frames 760 may be defined by dicing channels. In this embodiment, all outer sidewalls of each composite interposer (400, 500) may be vertically coincident with sidewalls of the molding compound die frame 760 within a same fan-out package 800. As used herein, a first surface and a second surface are vertically coincident if the second surface overlies or underlies the first surface and if there exists a vertical plane including the first surface and the second surface.

The at least one semiconductor die (701, 703) within each fan-out package 800 may comprise one or more system-on-a-chip (SoC) die 701 and one or more memory dies 703. In one embodiment, the at least one spacer die 710 within each fan-out package 800 may comprise a plurality of spacer dies 710. In one embodiment, each of the at least one semiconductor die (701, 703) within a fan-out package 800 may be laterally spaced from at least two outer sidewalls of the molding compound die frame 760 by a respective one of the plurality of spacer dies 710.

Generally, a fan-out package 800 of the present disclosure may comprise an interposer (400, 500), at least one semiconductor die (701, 703) bonded to the interposer (400, 500), at least one spacer die 710 bonded to the interposer (400, 500), and a molding compound die frame 760 laterally surrounding the at least one semiconductor die (701, 703) and the at least one spacer die 710. In one embodiment, all outer sidewalls of the interposer (400, 500) may be vertically coincident with sidewalls of the molding compound die frame 760. In one embodiment, a horizontal surface of the molding compound die frame 760 may be located within a same horizontal plane as top surfaces of the at least one semiconductor die (701, 703) and the at least one spacer die 710 within each fan-out package 800. In this embodiment, each of the at least one semiconductor die (701, 703) and the at least one spacer die 710 comprises a respective horizontal surface located within a horizontal plane including a top surface of the molding compound die frame 760.

Figure 16:
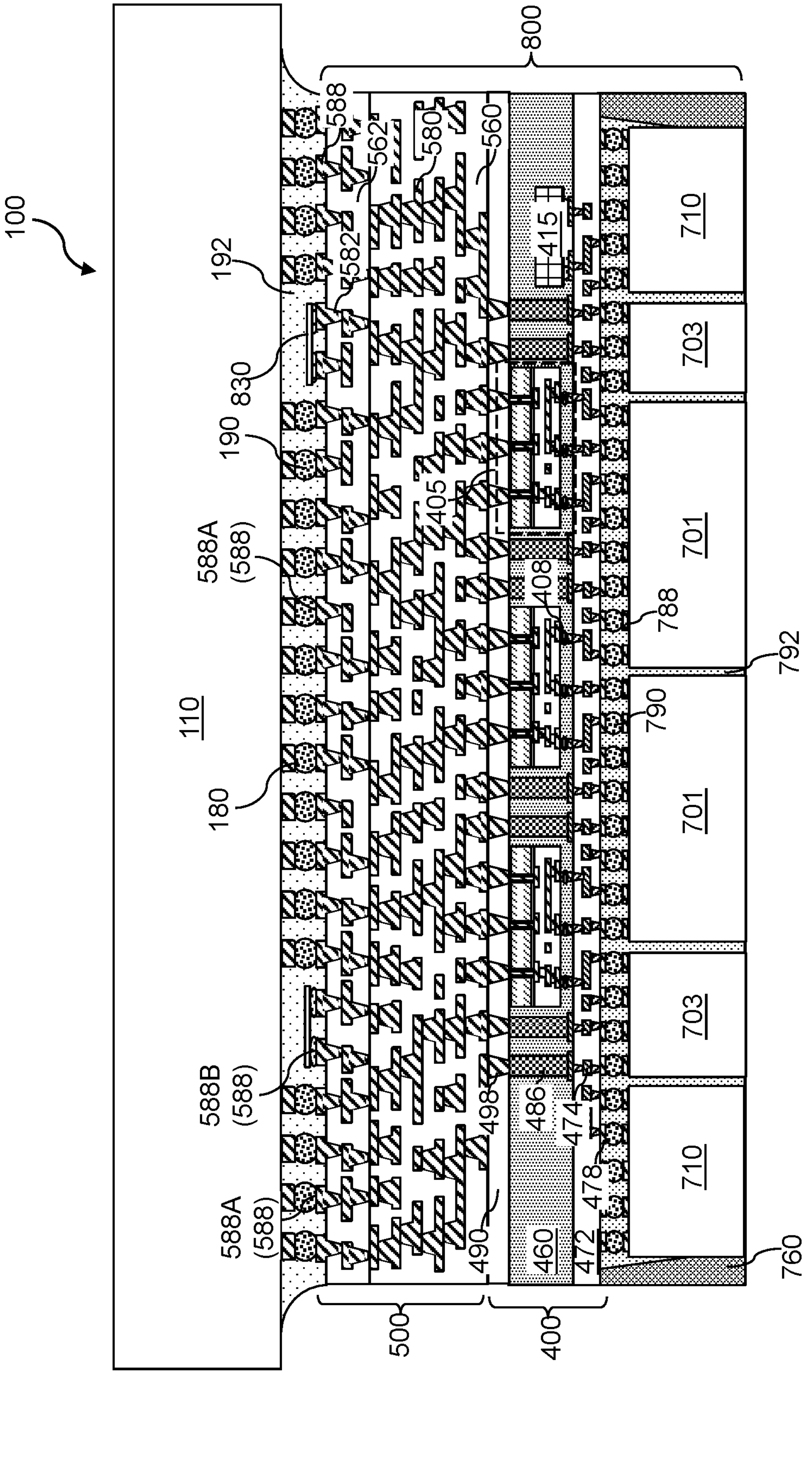
FIG. 16 is a vertical cross-sectional view of an exemplary structure obtained by attaching the fan-out package to a printed circuit board according to an embodiment of the present disclosure.

Referring to FIG. 16, a printed circuit board (PCB) 100 including a PCB substrate 110 and PCB bonding pads 180 may be provided. The PCB 100 includes a printed circuitry (not shown) at least on one side of the PCB substrate 110. The fan-out package 800 may be attached to the PCB 100 through the array of solder joints 190 by reflowing the solder joins 190 while the solder joints 190 are in contact with, or are placed in proximity to, the PCB bonding pads 180. Each solder joint 190 may be bonded to a respective one of the first interposer-side bonding pads 588A and to a respective one of the PCB bonding pads 180. An additional underfill material portion, which is herein referred to as a board-substrate underfill material portion 192 or a BS underfill material portion 192, may be formed around the solder joints 190 by applying and shaping an underfill material.

Generally, one, a plurality, or each, of the plurality of fan-out packages 800 formed by dicing the reconstituted wafer may be bonded to a respective printed circuit board 100. In one embodiment, each fan-out package 800 may comprise interposer-side bonding pads 588, the printed circuit board 100 may comprise printed-circuit-board bonding pads 180, and an array of solder joints 190 may be bonded to the interposer-side bonding pads 588 and to the printed-circuit-board bonding pads 180.

Figure 17:
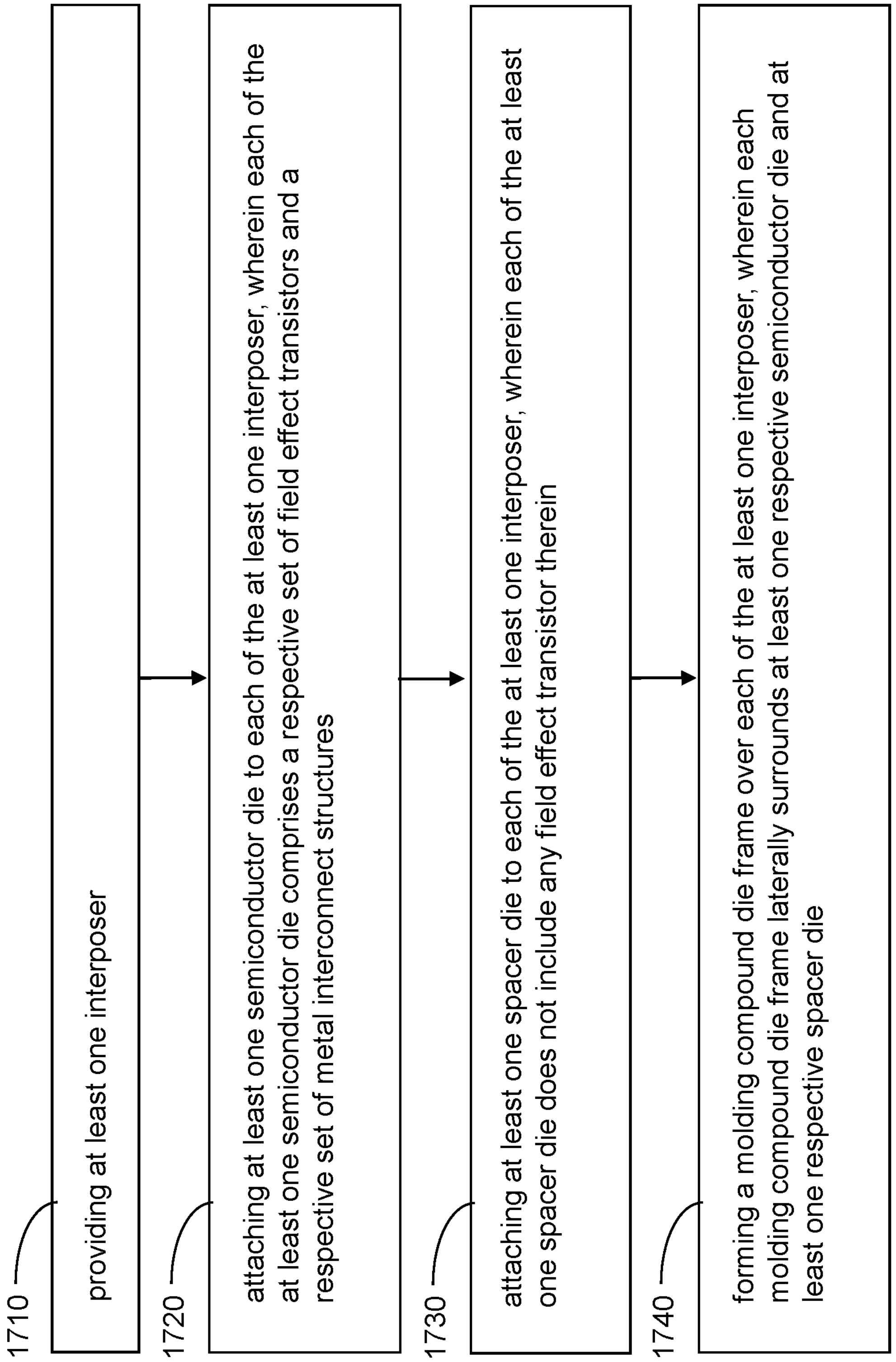
FIG. 17 is a flowchart illustrating steps for forming an exemplary structure according to an embodiment of the present disclosure.

Referring to FIG. 17, a flowchart illustrates steps for forming an exemplary structure according to an embodiment of the present disclosure.

Referring to step 1710 and FIGS. 1-7, at least one interposer (400, 500) may be provided.

Referring to step 1720 and FIGS. 8, 9, 10A, 10B, and 11A-11G, at least one semiconductor die (701, 703) may be attached to each of the at least one interposer (400, 500). Each of the at least one semiconductor die (701, 703) comprises a respective set of transistors and a respective set of metal interconnect structures.

Referring to step 1730 and FIGS. 8, 9, 10A, 10B, and 11A-11G, at least one spacer die 710 may be attached to each of the at least one interposer (400, 500). Each of the at least one spacer die 710 is free of (i.e., does not include), any transistor therein.

Referring to step 1740 and FIGS. 12-16, a molding compound die frame 760 may be formed over each of the at least one interposer (400, 500). Each molding compound die frame 760 laterally surrounds at least one respective semiconductor die (701, 703) and at least one respective spacer die 710.

Referring to all drawings and according to various embodiments of the present disclosure, a semiconductor structure is provided, which comprises: an interposer (400, 500) including on-interposer bump structures 478; at least one semiconductor die (701, 703) bonded to a first subset of the on-interposer bump structures 478 through first solder material portions 790, wherein each of the at least one semiconductor die (701, 703) comprises a respective set of transistors and a respective set of metal interconnect structures; at least one spacer die 710 bonded to a second subset of the on-interposer bump structures 478 through second solder material portions 790, wherein each of the at least one spacer die 710 is free of (i.e., does not include), any transistor therein; and a molding compound die frame 760 laterally surrounding each of the at least one semiconductor die (701, 703) and the at least one spacer die 710.

In one embodiment, a horizontal surface of the molding compound die frame 760 is located within a same horizontal plane as top surfaces of the at least one semiconductor die (701, 703) and the at least one spacer die 710. In one embodiment, all outer sidewalls of the interposer (400, 500) are vertically coincident with sidewalls of the molding compound die frame 760. In one embodiment, the semiconductor structure comprises an underfill material portion 792 extending as a single continuous structure around, and laterally surrounding each of, the first solder material portions 790 and the second solder material portions 790.

In one embodiment, one of the at least one spacer die 710 comprises a bulk material portion that continuously extends from a bottom surface of the one of the at least one spacer die 710 to a top surface of the one of the at least one spacer die 710. In one embodiment, the bulk material portion comprises a material selected from a polymer material, organosilicate glass, silicon oxide, silicon nitride, and a dielectric metal oxide.

In one embodiment, one of the at least one spacer die 710 comprises a redistribution die including a set of redistribution wiring interconnects and redistribution dielectric layers comprising a polymer material. In one embodiment, one of the at least one spacer die 710 comprises at least one passive device component selected from a resistor, a capacitor, and an inductor, or comprises an electrostatic discharge (ESD) circuit containing at least one diode.

In one embodiment, the at least one semiconductor die (701, 703) comprises one or more system-on-a-chip (SoC) die and one or more memory dies; the at least one spacer die 710 comprises a plurality of spacer dies 710; and each of the at least one semiconductor die (701, 703) is laterally spaced from at least two outer sidewalls of the molding compound die frame 760 by a respective one of the plurality of spacer dies 710. In one embodiment, the interposer (400, 500) comprises a stack of a local-silicon-interconnect-containing interposer (400, 500) and an organic interposer (400, 500).

According to another aspect of the present disclosure, an assembly is provided, which comprises: a fan-out package comprising an interposer (400, 500), at least one semiconductor die (701, 703) bonded to the interposer (400, 500), at least one spacer die 710 bonded to the interposer (400, 500), and a molding compound die frame 760 laterally surrounding the at least one semiconductor die (701, 703) and the at least one spacer die 710, wherein all outer sidewalls of the interposer (400, 500) are vertically coincident with sidewalls of the molding compound die frame 760; a printed circuit board; and an array of solder joints 190 bonded to interposer-side bonding pads 588 located on the interposer (400, 500) and to printed-circuit-board bonding pads located on the printed circuit board.

In one embodiment, each of the at least one semiconductor die (701, 703) and the at least one spacer die 710 comprises a respective horizontal surface located within a horizontal plane including a top surface of the molding compound die frame 760. In one embodiment, each of the at least one semiconductor die (701, 703) comprises a respective set of transistors and a respective set of metal interconnect structures; and each of the at least one spacer die 710 does not include (i.e., is free of), any transistor therein.

In one embodiment, one of the at least one spacer die 710 comprises a bulk material portion that continuously extends from a bottom surface of the one of the at least one spacer die 710 to a top surface of the one of the at least one spacer die 710. In one embodiment, one of the at least one spacer die 710 comprises a redistribution die including a set of redistribution wiring interconnects and redistribution dielectric layers comprising a polymer material.

According to various aspects of the present disclosure, the chip-on-wafer-on-board (CoWoB) structures of the present disclosure uses a fan-out package 800 having an expanded size through use of the at least one spacer die 710 and having a sufficient number of interposer-side bonding pads 588 to be bonded directly to a printed circuit board 100 and to provide sufficiently high bandwidth for signal transmission. The CoWoB structures of the present disclosure may be able to avoid process yield loss and high manufacturing cost that are associated with related structures known in the art.

In one embodiment, the package-side redistribution wiring interconnects (580, 582) of the present disclosure provide finer-pitch metal wiring than metal wiring that packaging substrates may provide, and thus, provide higher transmission efficiency per unit area. Use of the spacer dies 710 provides an increase in the total area of the fan-out packages 800 of the present disclosure so that a sufficient number of solder joints 190 necessary for formation of a ball grid array may be attached directly to the fan-out packages 800. The spacer structures 710 may function as mechanical buffer structures to provide higher reliability and enhanced stress immunity for the fan-out packages. The ability to directly bond the fan-out packages 800 of the present disclosure to a printed circuit board 100 may reduce the manufacturing cost and increase the manufacturing yield, while enabling a higher communication channel density per area. Specifically, the package-side redistribution wiring interconnects (580, 582) embodiments wafer-level communication for SoC dies 701 and data transmission to, and from, high bandwidth memory dies that are attached to the composite interposer (400, 500).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:

an interposer, comprising:

a die-side redistribution structure including on-interposer bump structures on a first side of the interposer; and a package-side redistribution structure on a second side of the interposer, wherein the second side is opposite to the first side;

a semiconductor die bonded to a first subset of the on-interposer bump structures through first solder material portions, wherein the semiconductor die comprises a set of transistors and a set of metal interconnect structures;

a spacer die bonded to a second subset of the on-interposer bump structures through second solder material portions, wherein the spacer die is free from any transistor therein;

a molding compound die frame laterally surrounding the semiconductor die and the spacer die; and a substrate on the second side of the interposer, wherein the package-side redistribution structure of the interposer is attached to the substrate.

2. The semiconductor structure of claim 1, wherein a horizontal surface of the molding compound die frame is located within a same horizontal plane as top surfaces of the semiconductor die and the spacer die.

3. The semiconductor structure of claim 1, wherein all outer sidewalls of the interposer are vertically coincident with sidewalls of the molding compound die frame.

4. The semiconductor structure of claim 1, further comprising an underfill material portion extending as a single continuous structure around, and laterally surrounding the first solder material portions and the second solder material portions.

5. The semiconductor structure of claim 1, wherein the spacer die comprises a bulk material portion that continuously extends from a bottom surface of the spacer die to a top surface of the spacer die.

6. The semiconductor structure of claim 5, wherein the bulk material portion comprises a bulk material selected from a polymer material, organosilicate glass, silicon oxide, silicon nitride, and a dielectric metal oxide.

7. The semiconductor structure of claim 1, wherein the spacer die comprises a redistribution die including a set of redistribution wiring interconnects and redistribution dielectric layers comprising a polymer material.

8. The semiconductor structure of claim 1, wherein the spacer die comprises at least one passive device component selected from a resistor, a capacitor, and an inductor, or comprises an electrostatic discharge (ESD) circuit containing at least one diode.

9. The semiconductor structure of claim 1, wherein:

the semiconductor die comprises a system-on-a-chip (SoC) die and a memory dies;

the spacer die comprises a plurality of spacer dies; and the semiconductor die is laterally spaced from at least two outer sidewalls of the molding compound die frame by a respective one of the plurality of spacer dies.

10. The semiconductor structure of claim 1, wherein the interposer further comprises a local-silicon-interconnect-containing interposer that contains a local silicon interconnect (LSI) bridge between the die-side redistribution structure and the package-side redistribution structure.

11. A semiconductor structure comprising:

an interposer comprising:

a lower interposer including a redistribution structure; and an upper interposer on the lower interposer and including a plurality of bump structures;

a semiconductor die attached to the interposer by the plurality of bump structures, wherein the semiconductor die comprises a plurality of semiconductor dies and the upper interposer comprises a local silicon interconnect (LSI) die configured to interconnect the plurality of semiconductor dies;

a spacer structure attached to the interposer by the plurality of bump structures and laterally adjacent the semiconductor die; and a molding material layer on the interposer around the semiconductor die and the spacer structure.

12. The semiconductor structure of claim 11, wherein the spacer structure comprises a plurality of spacer dies laterally adjacent the semiconductor die.

13. The semiconductor structure of claim 11, wherein the upper interposer further comprises an integrated passive device and the plurality of spacer dies are located over the integrated passive device and electrically coupled to the integrated passive device.

14. The semiconductor structure of claim 13, wherein the upper interposer further comprises:

a lower molded portion comprising the LSI die and the integrated passive device; and an upper redistribution structure on the lower molded portion, wherein the LSI die is electrically coupled to the plurality of semiconductor dies through the upper redistribution structure and the plurality of spacer dies are electrically coupled to the integrated passive device through the upper redistribution structure.

15. The semiconductor structure of claim 14, further comprising:

an underfill layer on the upper redistribution structure and around the plurality of bump structures, the plurality of semiconductor dies and the plurality of spacer dies.

16. The semiconductor structure of claim 11, further comprising:

a printed circuit board, wherein the interposer is attached to the printed circuit board.

17. The semiconductor structure of claim 16, further comprising:

a ball grid array on a bottom surface of the interposer, wherein the interposer is attached to the printed circuit board by the ball grid array.

18. A semiconductor structure comprising:

an interposer including a redistribution structure;

a plurality of semiconductor dies attached to the interposer by a plurality of bump structures, wherein the plurality of semiconductor dies comprises a functional die and a high bandwidth memory (HBM) die adjacent the functional die;

a spacer structure attached to the interposer by the plurality of bump structures and laterally surrounding the plurality of semiconductor dies, wherein an upper surface of the spacer structure is aligned with an upper surface of the plurality of semiconductor dies;

a molding material layer on the interposer around the plurality of semiconductor dies and the spacer structure, wherein a sidewall of the molding material layer is aligned with a sidewall of the interposer;

a printed circuit board, wherein the redistribution structure of the interposer is attached to the printed circuit board; and a ball grid array on a bottom surface of the redistribution structure, wherein the redistribution structure is attached directly to the printed circuit board by the ball grid array.

19. The semiconductor structure of claim 18, wherein the plurality of semiconductor dies comprises a functional die and a high bandwidth memory (HBM) die adjacent the functional die.

20. The semiconductor structure of claim 18, wherein the redistribution structure comprises:

a die-side redistribution structure, wherein the plurality of semiconductor dies are attached to the die-side redistribution structure; and a package-side redistribution structure attached to the substrate.

* * * * *